United States Patent
Sarkar et al.

(10) Patent No.: US 9,267,962 B2
(45) Date of Patent: Feb. 23, 2016

(54) SCANNING PROBE MICROSCOPE COMPRISING AN ISOTHERMAL ACTUATOR

(71) Applicant: ICSPI Corp., Waterloo (CA)

(72) Inventors: Niladri Sarkar, Waterloo (CA); Geoffrey Lee, Kitchener (CA); Duncan Wesley Strathearn, Waterloo (CA)

(73) Assignee: ICSPI Corp. (CA)

( * ) Notice: Subject to any disclaimer, the term of this patent is extended or adjusted under 35 U.S.C. 154(b) by 0 days.

(21) Appl. No.: 14/456,710

(22) Filed: Aug. 11, 2014

(65) Prior Publication Data

US 2015/0047078 A1 Feb. 12, 2015

Related U.S. Application Data

(60) Provisional application No. 61/864,105, filed on Aug. 9, 2013, provisional application No. 61/864,115, filed on Aug. 9, 2013.

(51) Int. Cl.
*G01Q 10/04* (2010.01)
*G01Q 20/04* (2010.01)
*B81B 3/00* (2006.01)

(52) U.S. Cl.
CPC .............. *G01Q 20/04* (2013.01); *B81B 3/0024* (2013.01); *G01Q 10/045* (2013.01)

(58) Field of Classification Search
CPC ....... B81B 3/0024; G01Q 10/02; G01Q 10/04
See application file for complete search history.

(56) References Cited

U.S. PATENT DOCUMENTS

| 6,275,320 | B1 * | 8/2001 | Dhuler | B81B 3/0054 |
| | | | | 310/306 |
| 6,333,583 | B1 * | 12/2001 | Mahadevan | B81B 3/0024 |
| | | | | 310/306 |
| 6,877,316 | B1 * | 4/2005 | Sarkar | B81B 3/0024 |
| | | | | 60/527 |
| 2003/0121260 | A1 * | 7/2003 | Sinclair | B81B 3/0024 |
| | | | | 60/527 |
| 2013/0021656 | A1 * | 1/2013 | Albus | G02B 26/0866 |
| | | | | 359/230 |

OTHER PUBLICATIONS

Oak et al. 'Development and Testing of a Multilevel Chevron Actuoator-Based Positioning System' Journal of Microelectromechanical Systems, vol. 20, No. 6, Dec. 2011, pp. 1298-1309.*
Kwan et al. 'Improved Designs for an Electrothermal In-Plane Microactuator' Journal of Microelectromechanical Systems, vol. 21, No. 3, Jun. 2012, pp. 586-595.*

* cited by examiner

*Primary Examiner* — Robert Kim
*Assistant Examiner* — Eliza Osenbaugh-Stewar
(74) *Attorney, Agent, or Firm* — Kaplan Breyer Schwarz & Ottesen, LLP

(57) ABSTRACT

A single-chip scanning probe microscope is disclosed, wherein the microscope includes an isothermal two-dimensional scanner and a cantilever that includes an integrated strain sensor and a probe tip. The scanner is operative for scanning a probe tip about a scanning region on a sample while the sensor measures tip-sample interaction forces. The scanner, cantilever, probe tip, and integrated sensor can be fabricated using the backend processes of a conventional CMOS fabrication process. In addition, the small size of the microscope system, as well as its isothermal operation, enable arrays of scanning probe microscopes to be integrated on a single substrate.

41 Claims, 11 Drawing Sheets

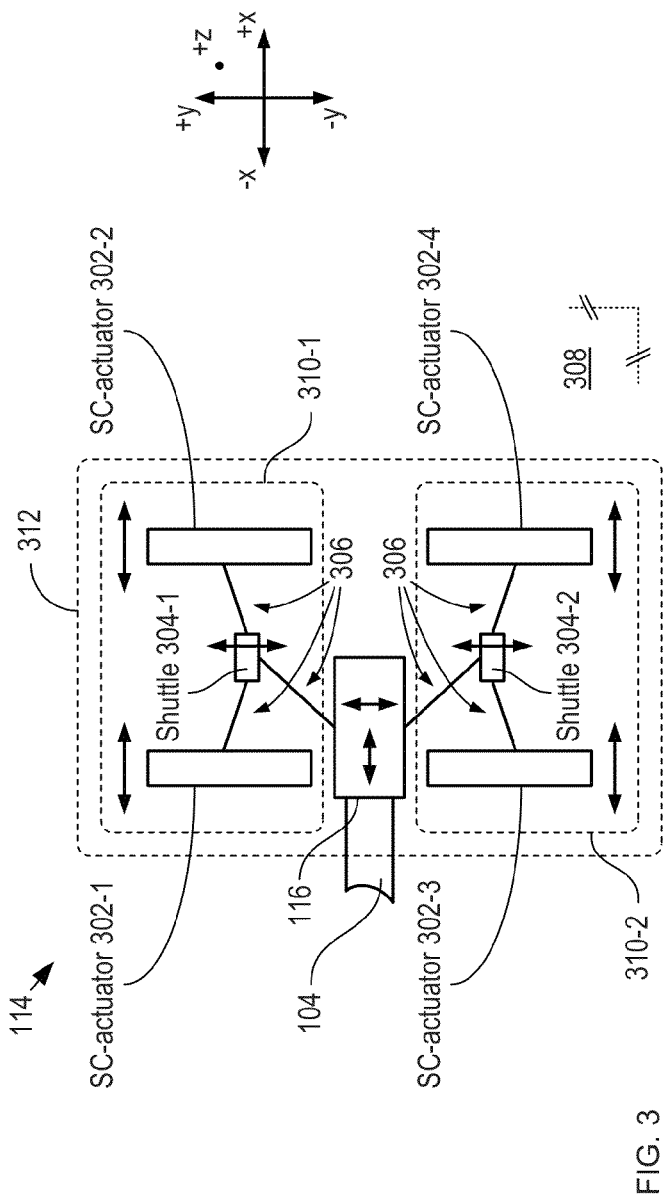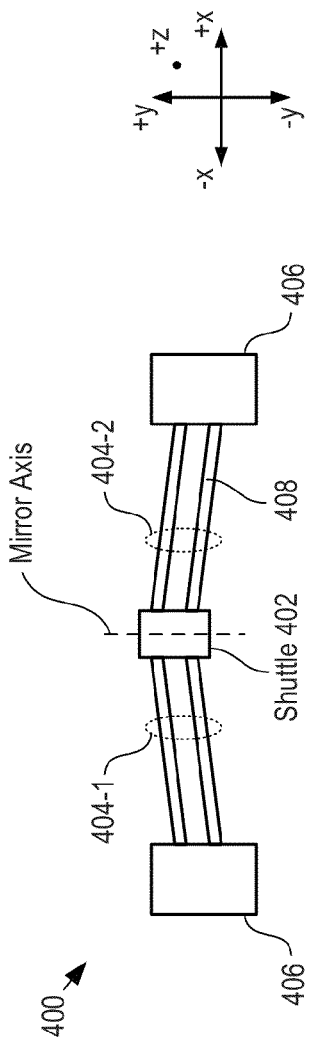
FIG. 3
FIG. 4 (Prior Art)

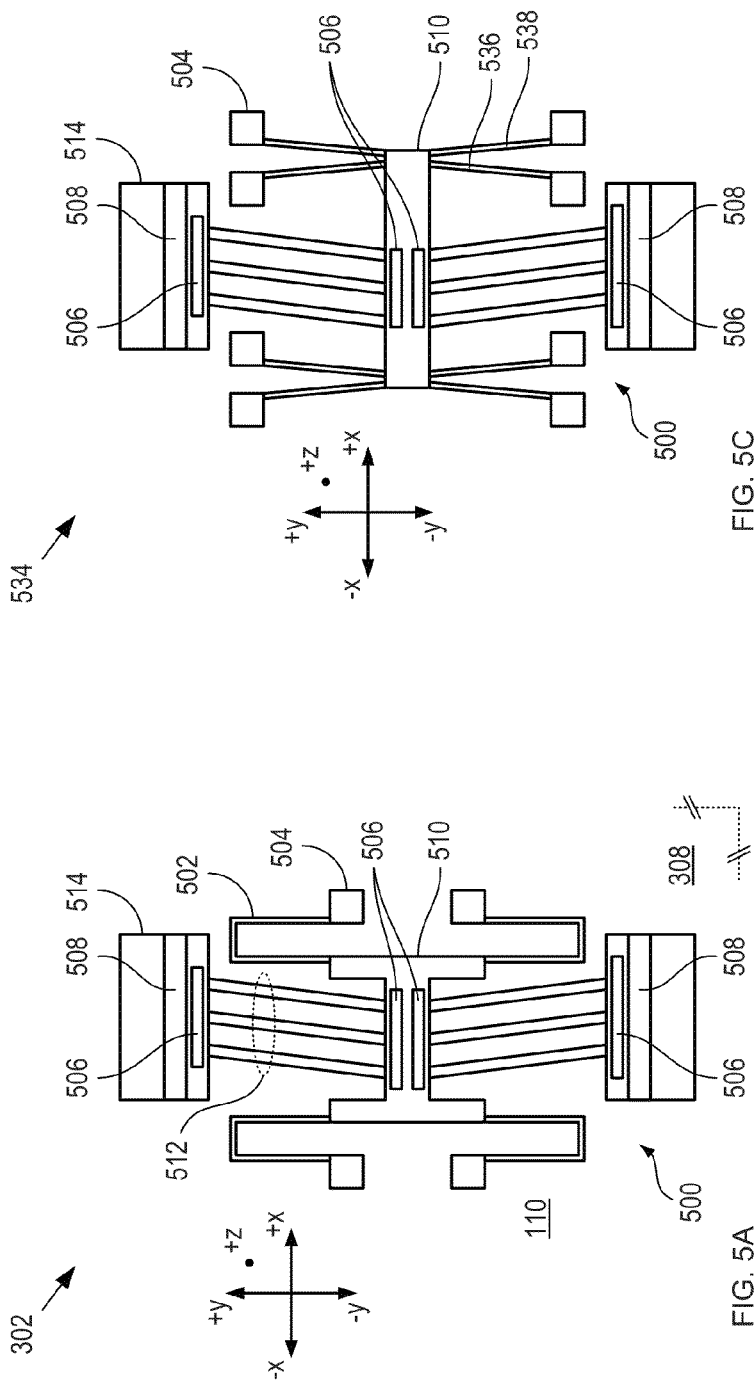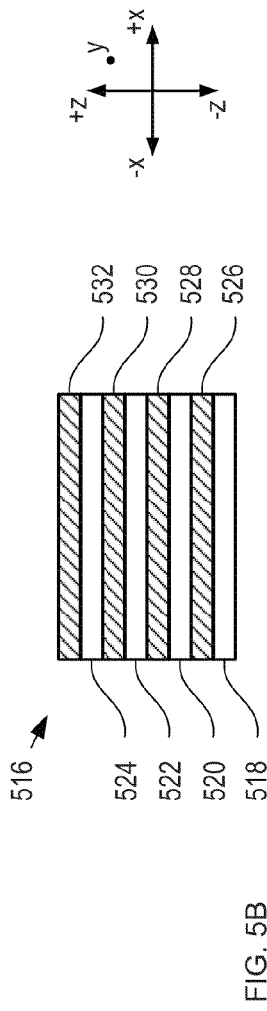
FIG. 5C
FIG. 5B
FIG. 5A

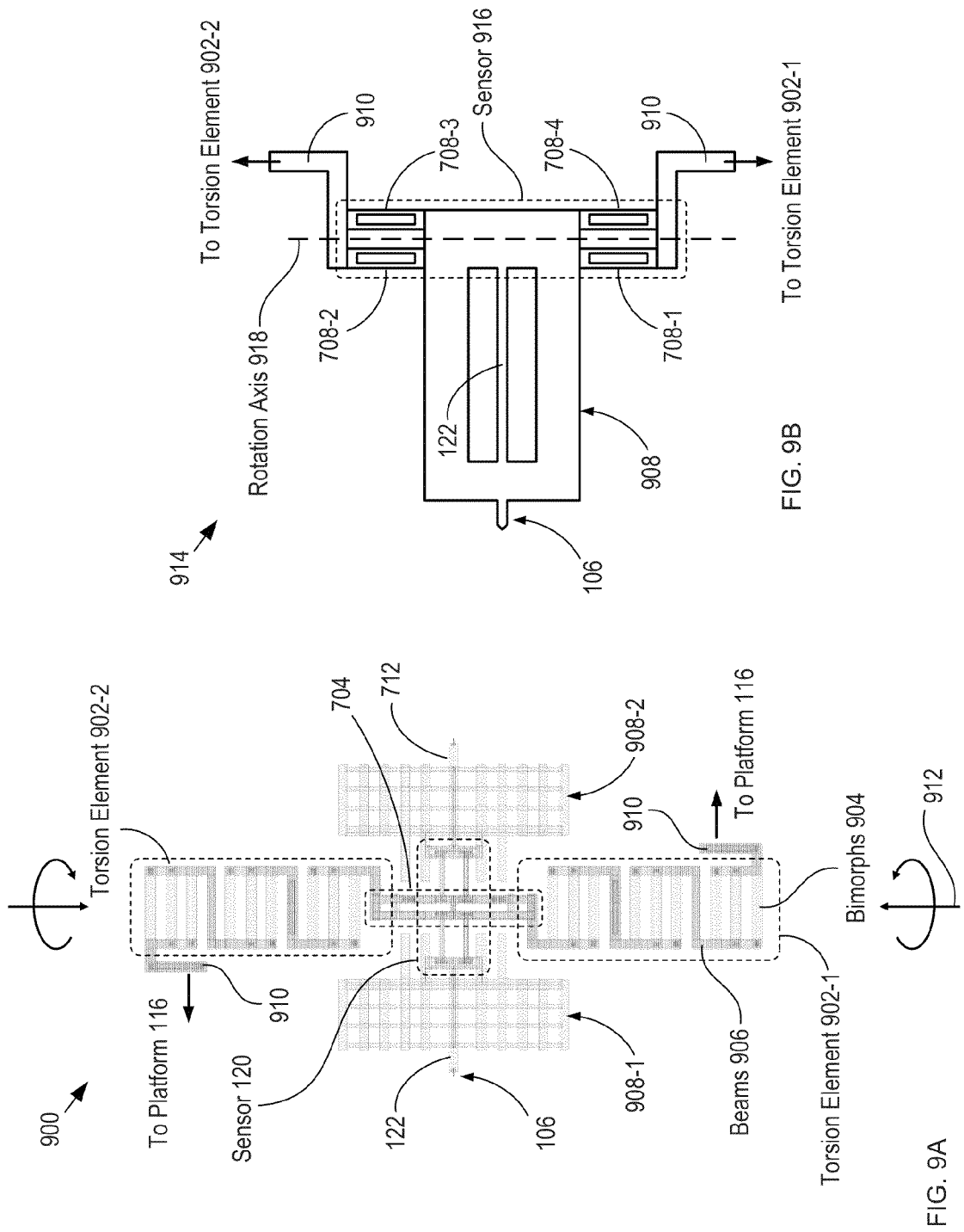

SCANNING PROBE MICROSCOPE COMPRISING AN ISOTHERMAL ACTUATOR

CROSS REFERENCE TO RELATED APPLICATIONS

This application claims the benefit of U.S. Provisional Application Ser. No. 61/864,105, filed Aug. 9, 2013, entitled "High-Q Resonator," and U.S. Provisional Application Ser. No. 61/864,115, filed Aug. 9, 2013, entitled "Torsional Resonant Cantilever," each of which is incorporated herein by reference. If there are any contradictions or inconsistencies in language between this application and one or more of the cases that have been incorporated by reference that might affect the interpretation of the claims in this case, the claims in this case should be interpreted to be consistent with the language in this case.

FIELD OF THE INVENTION

The present invention relates to MEMS-based devices in general, and, more particularly, to MEMS-based devices comprising thermal actuators.

BACKGROUND OF THE INVENTION

A scanning probe microscope (SPM) is a tool that enables formation of an image of a surface with angstrom-scale vertical and lateral resolution. There are many types of SPMs, including atomic-force microscopes (AFMs), ballistic electron emission microscopes (BEEMs), scanning thermal microscopes (SThMs), scanning tunneling microscopes (STMs), and many more. Each of these SPM types interrogates a surface and/or scans the surface in a different manner; however, in each, a probe tip is scanned over the surface and records the value of a surface parameter at myriad discrete locations. These parameter values are then mapped to form the image of the surface.

Dynamic AFM is, by far, the most widely used modality of scanning probe microscopy. In dynamic AFM, a sharp probe tip is moved very close to the surface under study (typically within Angstroms) and the probe is then raster scanned across the surface. The probe tip is connected to a resonator that is driven into oscillation during measurement. An image of the surface is then constructed from the force interactions between the tip and the surface during the scan. Dynamic AFM may be performed in the non-contact regime (in which tip-sample interaction forces are strictly attractive) or in the intermittent contact regime, in which the tip-sample interaction forces may be repulsive. If the probe is not operated in resonance, the modality is known as contact AFM, or static AFM. Contact AFM operates in the repulsive regime.

The force interactions between the tip and surface are determined using one of two common techniques—amplitude-modulation AFM (AM-AFM) or frequency-modulation AFM (FM-AFM). In AM-AFM, the force interactions between the tip and surface are determined by measuring the change in amplitude of the oscillation at a constant frequency—typically, just off the resonant frequency of the cantilever. In FM-AFM, the change in frequency of an oscillator that incorporates the resonator is measured using a feedback circuit (usually using a phase-locked loop), while the sensor is driven at its characteristic resonance. In cases where the cantilever is not in resonance, its static deflection can be used to determine tip-sample interaction forces; however, at significantly reduced sensitivity.

Typically, prior-art SPMs rely on the use of piezoelectric actuators. Unfortunately, piezoelectric actuators have several drawbacks with respect to their use in these applications. Piezoelectric actuators are relatively large but provide only a small range of motion. Their large size leads to bulky scanner designs that are susceptible to thermal drift, external vibration, and shock. In addition, piezoelectric actuators notoriously exhibit creep and hysteresis that, in an SPM, manifests as image distortion.

The large size and mass of piezoelectric actuator-based SPMs also limits mechanical bandwidth, which, in turn, limits imaging rate. Arrays of SPMs for performing distributed measurements have been suggested for alleviating the bandwidth bottleneck. Unfortunately, as arrays are scaled upwards, scanning speed declines to accommodate larger payloads.

MEMS-based thermal actuators offer the promise of overcoming some of the drawbacks of piezoelectric actuators for SPM applications, since they can be small yet still generate considerable force with a large range of motion. In addition, a thermal actuator can respond quickly to a control signal. Unfortunately, prior-art thermal actuators also have significant drawbacks that limit their utility in SPM applications.

First, many thermal actuators have a tendency to buckle out-of-plane when operated in a compressive mode.

Second, the response of a conventional thermal actuator is typically controlled via Joule heating that is induced by passing electric current through the device. In such operation, however, the temperature distribution within the device is difficult to control.

Third, thermal actuators are normally fabricated using low-stress material systems, such as Silicon-on-Insulator, where the structural material of the device comprises the substantially zero-stress silicon active-layer material. This avoids the high residual stress, as well as stress gradients that normally characterize thin films deposited on a substrate. As a result, most MEMS-based thermal actuators are poorly suited to fabrication using conventional high-volume foundry processes such as CMOS fabrication. The inability to fabricate actuators in a CMOS foundry, for example, impairs the ability to integrate thermal actuators with high-performance electronic circuitry.

Another challenge for prior-art SPM applications is measuring the tip-sample interaction forces with high bandwidth and resolution. Typically, these forces are measured using external optics (e.g., a laser-based displacement sensor) having a large free-space path. Such optical systems tend to be quite large, in and of themselves. In addition, they are expensive and cumbersome to align, adding significantly to the high cost of state-of-the-art SPM systems. Further, their large size and expense makes them difficult to implement in arrayed SPM systems.

Small, preferably single-chip, inexpensive, fast, stable and independent SPMs that do not incur bandwidth penalties upon array scaling would, therefore, be a significant advance in the state of the art.

SUMMARY OF THE INVENTION

The present invention enables a single-chip scanning probe microscope that is capable of scanning a two-dimensional region of a sample with improved performance, lowered cost, and shorter measurement time than the prior art. Embodiments of the present invention are well suited for use in single-element or arrayed atomic force microscopes, scanning thermal microscopes, magnetic force microscopes, electrostatic force microscopes, and the like.

An illustrative embodiment of the present invention is an atomic force microscope that includes a thermally actuated, two-dimensional scanner for scanning a probe tip about a scanning region on a sample. The probe tip is disposed at the free end of a cantilever that is attached to the scanner. As the probe tip interacts with the surface of the sample, tip-sample interaction forces are measured using an integrated strain sensor included in the cantilever. The small size of the scanners, as well as the integration of strain sensors into the device, enables formation of a single-chip SPM, as well as arrays of SPMs that are integrated on a single chip.

The two-dimensional scanner is based on a novel strapped-chevron thermal actuator. The strapped-chevron actuator is analogous to a prior-art chevron actuator; however, the strapped-chevron actuator includes additional mechanical elements (straps) that inhibit its out-of-plane motion. As a result, the strapped-chevron actuator is capable of greater range of motion and higher force than the conventional chevron actuator.

In addition, and in contrast to prior-art chevron actuators, a strapped-chevron actuator is amenable to fabrication using a standard CMOS fabrication process. This is due to the use of straps to inhibit out-of-plane buckling, which provides strapped-chevron actuators greater tolerance to the material stresses and stress gradients that inherently characterize the constituent layers of a CMOS material stack.

In addition, strapped-chevron actuators in the scanner are arranged to enable isothermal operation of the scanner. This enables movement of the probe tip throughout the scanning region without changes in the total power dissipation of the SPM. Since the power dissipation of a single SPM remains constant, arrays of SPMs can be integrated and operated on a single substrate without incurring thermal cross-talk between them.

In some embodiments, tip-sample interaction forces are measured at a strain sensor that is thermally balanced to mitigate the effects of parasitic thermal coupling effects within the SPM structure. In some embodiments, the balanced strain sensor provides a differential signal having approximately twice the sensitivity of a single strain sensor configuration.

In some embodiments, the two-dimensional actuator is a Cartesian scanner. In some embodiments, the two-dimensional actuator is a cylindrical scanner.

In some embodiments, a backside etch is used to remove structural material from one side of a strain sensor structure so as to shift the neutral axis of the structure away from the strain sensing material. As a result, the same level of force applied to the overall structure gives rise to an increased strain at the strain sensing material itself and, therefore, improves the sensitivity of the strain sensor.

An embodiment of the present invention is an apparatus comprising: a substrate that defines a first plane; a first platform that defines a second plane that is parallel with the first plane; and a first scanner that is operative for moving the first platform in two dimensions within the second plane, wherein the first scanner is dimensioned and arranged to constrain motion of the first platform to the second plane, the first scanner comprising a plurality of thermal actuators that are mechanically coupled such that they collectively define an isothermal scanner; wherein the first platform, the first scanner, and the substrate are monolithically integrated.

BRIEF DESCRIPTION OF THE DRAWINGS

FIG. 3 depicts a schematic drawing of a thermal actuator in accordance with the illustrative embodiment of the present invention.

FIG. 4 depicts a schematic drawing of a chevron actuator in accordance with the prior art.

FIG. 5A depicts a detailed view of a representative SC-actuator 302.

FIG. 5B depicts a schematic drawing of cross-sectional view of a beam 512.

FIG. 5C depicts an SC-actuator having an alternative strap configuration in accordance with the present invention.

FIG. 9A depicts a schematic drawing of a first alternative vertical actuator in accordance with the present invention.

FIG. 9B depicts a schematic drawing of a portion of a cantilever having a sensor configuration that is particularly well suited for use with vertical actuator 900.

DETAILED DESCRIPTION

The following terms are defined for use in this Specification, including the appended claims:

Monolithically integrated is defined as formed either: in the body of a substrate, typically by etching into the substrate or; on the surface of the substrate, typically by patterning layers disposed on the substrate. The definition of monolithically integrated explicitly excludes hybrid integration, wherein a first structure is joined to a second structure (typically after each structure has been formed) using a process such as solder bonding, wafer bonding, gluing, and the like.

Isothermal operation is defined as operation at a constant power dissipation throughout an operating range. A device or system that operates in isothermal fashion dissipates constant power over its operating range, which results in a steady-state heat flow into and out of the device or system. For example, an isothermal actuator is an actuator that operates at a constant power throughout its operating range. In similar fashion, an isothermal scanner is a system that scans an element (e.g., a platform) through a range of positions at constant power. In some cases, an isothermal system or isothermal actuator includes one or more non-isothermal actuators that collectively operate in isothermal fashion.

Mechanically coupled is defined as that two or more objects interact with one another such that movement of one of the objects affects the other object. For example, consider an actuator and a platform. When actuated, the actuator causes the platform to move. The actuator and the platform are therefore considered to be "mechanically coupled." Mechanically coupled devices can be, but are not necessarily, directly physically connected. Continuing with the example of the platform and the actuator, if the platform supports a load such that the load moves when the platform moves (due to the actuator), then the actuator and the load are considered to be mechanically coupled as well.

CMOS layer stack is defined as a combination of layers that are formed as part of a conventional CMOS integrated circuit fabrication process.

Figure 1:
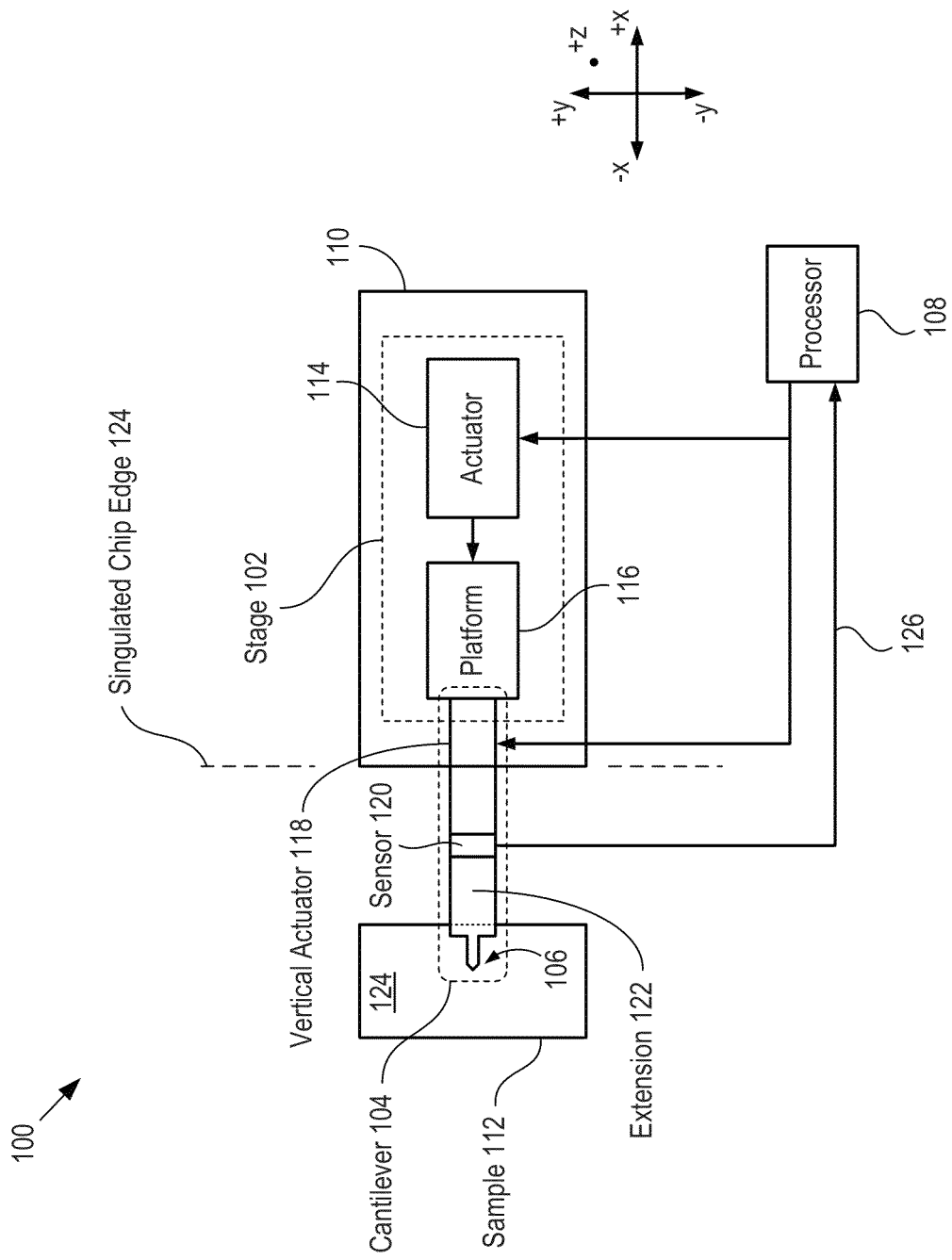
FIG. 1 depicts a schematic drawing of a single-chip scanning-probe microscope in accordance with an illustrative embodiment of the present invention.

FIG. 1 depicts a schematic drawing of a single-chip scanning-probe microscope in accordance with an illustrative embodiment of the present invention. SPM 100 is a dynamic atomic-force microscope (AFM) that includes stage 102, cantilever 104, probe tip 106, and processor 108.

Stage 102 is a two-axis translation stage that includes scanner 114 and platform 116. Cantilever 104 is mechanically connected with platform 116 and includes vertical actuator 118, sensor 120, extension 122, and probe tip 106. Cantilever 104 extends from platform 116 such that its free end projects over singulated chip edge 124. Probe tip 106 is disposed at the free end of cantilever 104.

It is an aspect of the present invention that stage 102, cantilever 104, and probe tip 106 can be fabricated on common substrate 110 and comprise layers of a conventional CMOS-fabrication process, as discussed below. In some embodiments, SPM 100 includes additional components, such as CMOS circuitry, other electronic circuitry, sensors, and/or actuators that are integrated on substrate 110. In some embodiments, one or more of these elements of SPM 100 are fabricated using a fabrication process other than a CMOS fabrication operation. In some embodiments, processor 108 is also integrated on substrate 110.

Although the illustrative embodiment is a scanning probe microscope that is configured as an AFM, it will be clear to one skilled in the art, after reading this Specification, how to specify, make, and use alternative embodiments of the present that functions as a different scanning-probe device, such as a Scanning Thermal Microscopes (SThM), Scanning Microwave Microscopes (SMM), Kelvin Probe Force Microscopes (KPFM), Conductive AFM (cAFM), Magnetic Force Microscopes (MFM), Electrostatic Force Microscopes (EFM), Scanning Gate Microscopes (SGM), Scanning Capacitive Microscopes (SCM), among others.

Figure 2:
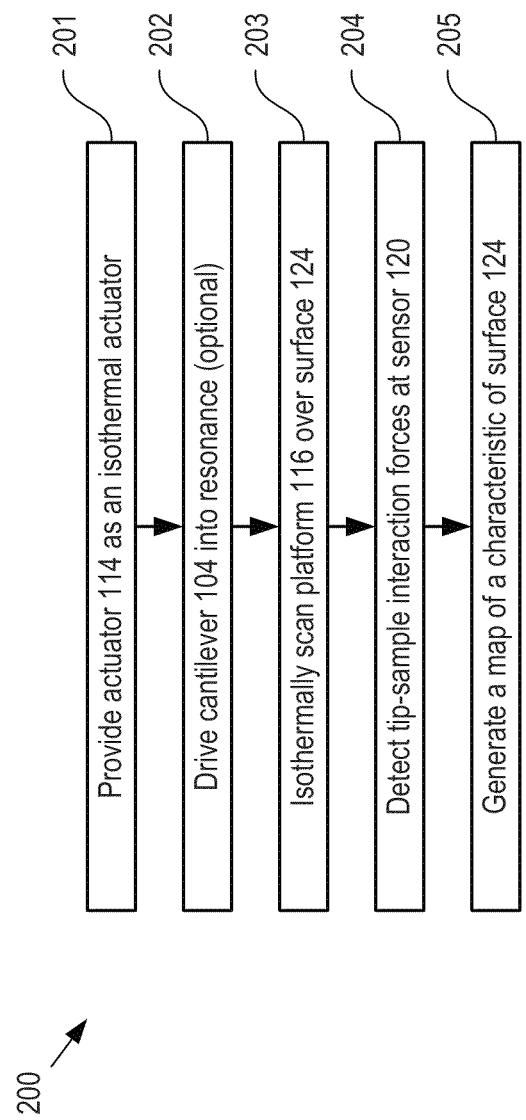
FIG. 2 depicts operations of a method for scanning the surface of a sample in accordance with the illustrative embodiment of the present invention.

FIG. 2 depicts operations of a method for performing atomic-force microscopy in accordance with the illustrative embodiment of the present invention. Method 200 begins with operation 201, wherein scanner 114 is provided. Scanner 114 is described in detail below and with respect to FIGS. 3, 5A-B, and 6.

At operation 202, vertical actuator 118 drives cantilever 104 into resonance in the z-direction. It should be noted that, for some SPM applications, cantilever 104 does not need to be operated in resonance; therefore, operation 202 is optional. Cantilever 104 is described in detail below and with respect to FIG. 7.

At operation 203, in response to commands from processor 108, scanner 114 moves platform 116 such that probe tip 106 is scanned about a two-dimensional region of surface 124 on sample 112 (i.e., the scanning region). As discussed below, it is an aspect of the present invention that scanner 114 can be arranged to scan platform 116 in two-dimensions in isothermal fashion.

At operation 204, as probe tip 106 traverses the surface of sample 112, tip-surface interactions are measured by sensor 120, which is integrated into cantilever 104. Sensor 120 in accordance with the present invention is described below and with respect to FIGS. 7 and 9A-B.

At operation 205, processor 108 generates a map of a physical property of interest for the surface of sample 112 based on output signal 126 from sensor 120.

As mentioned above, typically, prior-art SPMs rely on the use of piezoelectric actuators. Unfortunately, piezoelectric actuators have several drawbacks—particularly as related to their use in an SPM design. For example, piezoelectric actuators are large but provide only a small range of motion. In addition, their large size leads to large bulky scanner designs that are susceptible to thermal drift, as well as external vibration and shock. Further, piezoelectric actuators notoriously exhibit creep and hysteresis that, in an SPM application, manifests as image distortion. Still further, their large mass gives rise to a limitation on their mechanical bandwidth, which, in turn, limits the imaging rate of the SPM in which they are used.

Thermal actuators, on the other hand, are very attractive for use in SPM applications in general, and in arrayed SPMs, in particular. Their small size, the amount of force they can generate, the amount of deflection they can provide, and their response speed make them nearly ideal for these purposes. For these reasons, embodiments of the present invention preferably include thermal actuators in stage 102 and cantilever 104.

FIG. 3 depicts a schematic drawing of a thermal actuator in accordance with the illustrative embodiment of the present invention. Scanner 114 comprises strapped-chevron actuators 302-1 through 302-4 (referred to, collectively, as SC-actuators 302), shuttles 304-1 and 304-2, and flexures 306, which, collectively, are operative for moving platform 116 selectively within x-y plane 308. As noted above, x-y plane 308 is substantially parallel with the plane of underlying substrate 110.

In operation 201, SC-actuators 302 are arranged to define a pair of isothermal actuators 310-1 and 310-2, which collectively scan platform 116 in two dimensions. Specifically, SC-actuators 302-1 and 302-2 collectively define one-dimensional isothermal actuator 310-1, while SC-actuators 302-3 and 302-4 collectively define one-dimensional isothermal actuator 310-2. Since each of isothermal actuators 310-1 and 310-2 operate at constant power, the temperature distribution in the region surrounding each remains constant over their entire respective operating ranges. As a result, the heat flow into and out of region 312 remains constant as scanner 114 moves platform 116 throughout its entire scanning range. In other words, scanner 114 is an isothermal scanner. A representative isothermal actuator 310 and its operation are described below and with respect to FIG. 6.

It is an aspect of the present invention that scanner 114 overcomes some of the disadvantages of prior-art actuators—specifically, (1) it mitigates out-of-plane deformation that plagues some thermal actuators of the prior art, which enables fabrication using conventional CMOS processes, and (2) it avoids thermal crosstalk that impairs prior-art thermally actuated devices (particularly arrayed devices) by operating in an isothermal manner.

Mitigation of Out-of-Plane Deformation

SC-actuator 302 is an improved version of the conventional thermal chevron actuator (hereinafter referred to as a "chevron actuator"), which is well known in the prior art. Chevron actuators are disclosed, for example, by Que, et al., in "Bent-beam electrothermal actuators for high force applications," Proc. MEMS '99, pp. 31-36, (1999), which is incorporated herein by reference. For comparison with SC-actuators of the present invention, a brief discussion of prior-art chevron actuators is provided here.

FIG. 4 depicts a schematic drawing of a chevron actuator in accordance with the prior art. Chevron actuator 400 includes shuttle 402, beam arrays 404-1 and 404-2, and anchors 406.

Beam arrays 404-1 and 404-2 include a plurality of parallel beams 408, which are arranged such that arrays of the beams mirror each other on opposing sides of central shuttle 402. The amount of force and displacement provided by chevron actuator 400 is based on the number of beams 408 included in beam arrays 404-1 and 404-2. Beams 408 and shuttle 402 are released from an underlying substrate in conventional MEMS fashion. As a result, they are movable with respect to the substrate but are collectively physically attached between anchors 406, which are immovable with respect to the substrate. Each of beams 408 attaches to the shuttle and its respective anchor in non-normal fashion.

In typical operation, electric current is passed through the chevron actuator from anchor to anchor and the resistance of the beams gives rise to Joule heating. As a result, beams 408 undergo thermal expansion along their axial directions. Since each beam is constrained at its attachment to an anchor, as well as by a matching beam located directly across the mirror axis, the point of connection between the beams (i.e., shuttle 402) can only translate along the direction of the mirror axis. In other words, the in-plane components of the thermal expansion forces directed perpendicular to the mirror axis cancel, while the in-plane force components directed along the mirror axis add, thereby moving shuttle 402 along the mirror axis.

For the purposes of this Specification, including the appended claims, a "chevron actuator" is defined as an actuator as depicted in FIG. 4, wherein the actuator includes: a shuttle having a mirror axis; straight beams that extend between the shuttle and each of a pair of anchors in a plane, where the beams mirror each other on either side of the mirror axis and each beam is oriented at the same non-orthogonal angle with the mirror axis in the plane; wherein an increase in the temperature of the beams causes the beams to lengthen and bend to move the shuttle in a first direction in the plane, where the first direction is aligned with the mirror axis, and wherein a decrease in the temperature of the beams causes them to shorten and move the shuttle in a second direction that is opposite the first direction.

There are several significant drawbacks to the conventional chevron actuator, however.

First, the in-plane forces from thermal expansion must be contained within the plane of actuation. Any out-of-plane curvature resulting from residual stress gives rise to a third force component at the connection point that is directed out of the plane of the actuator, thereby detracting from the desired in-plane force and, potentially manifesting as out-of-plane buckling. As a result, prior-art chevron actuators have found limited utility and are typically operated over a limited range of motion.

Second, since the temperature of the actuator is controlled via Joule heating of the beams themselves, the temperature distribution in such a configuration is difficult to control. To overcome this challenge, significant effort has been spent on contouring the beam geometry in order to tailor the local resistance of the beam and optimize the distribution of power dissipation.

It should be noted, however, that uniform temperature distribution over the length of the beams cannot be achieved using Joule heating since the anchor points are connected to the substrate and act as a "thermal ground." Further this thermal ground reduces the efficiency of the chevron actuator by allowing heat to "leak" out of the device and into the underlying substrate.

Another significant disadvantage of prior-art chevron actuators is that they require fabrication in low-stress MEMS processes, such as Silicon-on-Insulator-based fabrication, wherein the chevron structure comprises the substantially zero-stress silicon active layer material. The need for low-stress structural material arises, in part, from the tendency of chevron actuators to produce in-plane compressive strains that can readily manifest as out-of-plane buckling, as mentioned above. This tendency to buckle is exacerbated by the high residual stress and stress gradients that characterize the constituent materials of a conventional CMOS layer stack. As a result, conventional chevron actuator structures are poorly suited to fabrication using conventional CMOS processing. The inability to fabricate useful chevron actuators in a CMOS foundry has limited their adoption in MEMS-based systems due to high cost and the need to use hybrid integration techniques to combine them with electronic circuitry and other actuators and/or sensors.

FIG. 5A depicts a detailed view of a representative SC-actuator 302. SC-actuator 302 includes chevron actuator 500, straps 502, strap anchors 504, heaters 506, and thermal isolation regions 508.

Chevron actuator 500 is analogous to chevron actuator 400 and includes shuttle 510, beams 512, and anchors 514. In contrast to chevron actuator 400, however, chevron actuator 500 the layer structure of chevron actuator 500 (which includes multiple CMOS metallization layers) avoids the development of significant Joule heating in beams 512, themselves. While the metallization layers included in beams 512 enable the beams to conduct electric current, the resistance of the beams is very low as compared to that of heaters 506. As a result, chevron actuators in accordance with the present invention are externally heated chevron actuators. For the purposes of this Specification, including the appended claims, an "externally heated chevron actuator" is defined as a chevron actuator in which Joule heating in beams 512 is insignificant and the temperature of the chevron actuator is based on substantially only heat provided by heaters 506.

SC-actuators in accordance with the present invention improve upon the conventional chevron actuator by mitigating its tendency to buckle out of plane via the addition of straps that are selectively compliant within the plane of the SC-actuator. As a result, an SC-actuator can be used to provide a significantly larger range of motion.

In addition, it is another aspect of the present invention that, contrary to conventional wisdom, MEMS-based thermal actuators (and, in particular, SC-actuators), as well as other SPM structures, can be formed using the back-end processes of a conventional CMOS integrated circuit fabrication process. As a result, the present invention overcomes the incompatibility of prior-art chevron actuators and CMOS fabrication. Some embodiments of the present invention are, therefore, afforded significant advantages over the prior art by enabling a single-chip SPM on a substrate that can also include complex electronic circuitry, as well as other sensors and/or actuators.

SPM Fabrication Using Conventional CMOS Processing

It has been demonstrated in the prior art that some MEMS actuator and sensor systems formed can be formed using structural layers comprising materials formed in conventional CMOS fabrication processes. Examples of such systems are disclosed, for example, by Fedder, et al., in "Laminated High Aspect Ratio Microstructures in a conventional CMOS process," *Proc. MEMS '96*, pp. 13-18, (1996), which is incorporated herein by reference. Although such systems demonstrate the utility of employing back-end-of-line (BEOL) processes to monolithically integrate sensors, actuators, and electronics into a single platform, one skilled in the art will recognize that the material properties available to the MEMS designer are not well suited for scanning probe microscope fabrication.

One skilled in the art will recognize that a typical BEOL layer stack included in a conventional CMOS fabrication process includes silicon dioxide, polysilicon, titanium-tungsten (TiW), tungsten (W), aluminum, and copper. Many of the physical and electrical properties of these materials would be highly desirable in an SPM; however, they are simultaneously undesirable in CMOS circuits because they negatively impact the performance and/or long term stability of the electronic devices. As a result, CMOS foundries have expended a great deal of effort to suppress these material characteristics.

Polysilicon, for example, is characterized by a resistance that changes as a function of temperature. For high-quality CMOS circuitry that is stable over a wide temperature range, the temperature coefficient of resistance (TCR) is best kept very low. As a result, a great deal of effort has been expended to develop polysilicon having low TCR in conventional CMOS foundries. In contrast, polysilicon having a high TCR enables the formation of an SPM that can measure thermal-domain effects with high sensitivity.

Polysilicon is also piezoresistive. For CMOS circuitry, a low piezoresistive coefficient (PZR) is desirable to mitigate packaging-induced strain that can negatively affect the stability of CMOS circuits. In an SPM, however, a high PZR is desirable as it enables the inclusion of piezoresistive sensors that can be used to measure such quantities as tip-surface forces, tip position, and the like.

Similar tradeoffs exist with respect to the other BEOL materials as well. For example, aluminum and silicon dioxide have a significant residual-stress mismatch, which can be exploited to form out-of-plane actuators in a MEMS device. This same residual-stress mismatch, however, restricts the design space for lateral electrothermal actuators, because parasitic out-of-plane actuation can occur before any useful mechanical work is performed by the device. Further, a conventional CMOS process desires material stacks (e.g., polysilicon/TiW) having low Seebeck coefficients to enable operation over a large temperature range; however, a high Seebeck coefficient enables the formation of thermocouples that can be used in an SPM to monitor thermal-domain effects.

Still further, the materials included in a conventional CMOS layer structure give rise to additional complications for thermally actuated MEMS devices. Electrothermal actuators necessarily undergo large temperature excursions while operating. The material properties that are exploited in physical sensors are typically temperature dependent. As a result, the large temperature swings associated with thermal actuation lead to parasitic disturbances within a sensor that compete with the signal of interest. The use of polysilicon as a strain sensor, even though attractive for many reasons, is particularly problematic because the TCR of polysilicon is substantial.

One skilled in the art, therefore, would expect that a conventional CMOS process would be ill-suited to the fabrication of a single-chip SPM—particularly one that employs thermal actuators, such as the chevron actuator. By restricting out-of-plane motion with straps 502, however, the present invention mitigates the deleterious effects of out-of-plane forces in conventional chevron actuator designs. As a result, the present invention enables a high-resolution, single-chip SPM that can be fabricated in a conventional CMOS process.

FIG. 5B depicts a schematic drawing of cross-sectional view of a beam 512. It should be noted that the structure of beam 512 is representative of most of the structural elements in SC-actuator 302, such as shuttle 510 and straps 502, etc. Beam 512 comprises material stack 516, which includes alternating layers of silicon dioxide (i.e., silicon dioxide layers 518-524) and metal (i.e., aluminum layers 526 through 532). Structural material stack 516 comprises layers formed in the back-end-of-line processing of a conventional CMOS fabrication process. In some embodiments, some of these constituent layers are not included in the structural material used to form one or more mechanical elements. In some embodiments, a polysilicon layer is included (typically located within silicon dioxide layer 518) to facilitate Joule heating or as part of a strain or temperature sensing element.

Returning now to FIG. 5A the motion of chevron actuators 500 is constrained to plane 308 by straps 502, which extend from shuttle 510 to strap anchors 504.

Anchors 514 and strap anchors 504 are regions of structural material that are substantially immovable with respect to substrate 110. Strap anchors 504 also enable electrical connectivity between SC-actuator 302 and processor 108 (not shown for clarity).

One skilled in the art will recognize that the spring constants of strap 502 within plane 308 and in the z-direction (i.e., in-plane and out-of-plane, respectively) scales inversely with its length, l, cubed (i.e., $k \propto 1/l^3$), but its in-plane spring constant is only linearly affected by a change in its thickness, h, (i.e., the dimension of strap 502 in the z-direction). The out-of-plane spring constant of strap 502 is strongly affected by h, however, since it scales as $h^3$. This implies that a change in the length of a strap affects its in-plane and out-of-plane stiffness equally, while an increase in its thickness can provide a strap with very high stiffness in the z-direction without significantly affect its resistance to in-plane motion. It should be noted that the high stiffness in the z-direction is particularly advantageous for SPM applications, as it prevents pull-in effects from attractive tip-sample forces (Van der Waals forces) that can lead to catastrophic tip crashes during operation of SPM 100.

As a result, each of straps 502 is a folded beam having an in-plane width that is significantly smaller than its thickness (i.e., its dimension in the z-direction). As a result, straps 502 are very stiff with respect to motion out of plane 308 but are relatively compliant with respect to in-plane motion. As a result, straps 502 substantially constrain the motion of chevron actuator 500 to only in-plane motion, thereby suppressing undesirable out-of-plane buckling.

In some embodiments, in addition to resisting out-of-plane motion of shuttle 510, at least one of straps 502 provides an electrically conductive path between processor 108 and at least one heater 506 or sensor 120. This avoids inadvertent Joule heating in other regions of SPM 100 that could lead to parasitic behavior.

In some embodiments, at least one of straps 502 is operative for providing a short thermal shunt path that mitigates thermal coupling between different areas of SPM 100 and/or other SPM structures included on substrate 110.

Heaters 506 are polysilicon regions that operate as ohmic heaters. Heaters 506 are located proximal to beams 512 on each of shuttle 510 and anchors 514. The inclusion of heaters 506 in these locations enables improved uniformity of temperature distribution along beams 512 as compared to Joule heating arrangements.

Thermal isolation regions 508 are regions of silicon dioxide that inhibit the flow of heat into the substrate through anchors 514, thereby mitigating the thermal-ground effect. The heat generated by heaters 506, therefore, is forced into beams 512 instead, thereby improving the efficiency at the expense of the response time of the thermal actuator.

The inclusion of thermal isolation regions 508 in anchors 514 provides a low thermal-conductivity path between beams 512 and the anchors. This facilitates the even distribution of heat in beams 512, which significantly improves actuator efficiency. In some embodiments, it is desirable to enable heat to flow more freely from SC-actuator 304 to improve its operating bandwidth. In such embodiments, thermal isolation regions 508 are not included in anchors 514.

Although not shown, thermal sensors are typically included in thermal actuators of the present invention to provide a direct measurement of local temperature at critical points on the sensors. MEMS-based thermal actuators comprising integrated temperature sensors are described in detail in U.S. Pat. No. 8,502,561, which is incorporated herein by reference.

The heater configuration of SC-actuator 302 provides a significantly improved heat distribution and actuator operation as compared to prior-art Joule heating arrangements. For example, in the prior art, Joule heating gives rise to a maximum temperature being reached in the center of the shuttle, while the remainder of the structure is at a lower temperature. As a result, a monotonic temperature gradient exists from the anchors to the shuttle. In SC-actuator 302, however, thermal isolation regions 508 substantially thermally isolate anchors 514 enabling beams 512 to retain most of the generated heat. Further, since the temperature of the beams is substantially uniform, the entire length of the beams contributes to deflection of shuttle 510. As a result, comparable deflection of shuttle 510 can be attained at a lower shuttle temperature. Alternatively, significantly greater displacement of the shuttle can be achieved for the same shuttle temperature.

FIG. 5C depicts an SC-actuator having an alternative strap configuration in accordance with the present invention. SC-actuator 534 includes chevron actuator 500, strap anchors 504, heaters 506, and straps 536 and 538.

SC-actuator 534 is analogous to SC-actuator 302; however SC-actuator 534 is constrained to in-plane motion by straps 536 and 538, which are arranged in a cross-strap configuration.

One skilled in the art will recognize, after reading this Specification, that the features included in each of the SC-actuators can be combined in any manner without departing from the scope of the present invention.

Each of straps 536 and 538 are analogous to straps 502 described above. In some embodiments, straps 536 and 538 include polysilicon that enables the straps to provide output signals based on their induced strain.

The cross-strap configuration of straps 536 and 538 provides SC-actuator 534 with a thermally balanced strain sensor for static and dynamic position measurement. When shuttle 510 is displaced in the negative x-direction, straps 536 are in compression while straps 538 are in tension. In similar fashion, when shuttle 510 is displaced in the positive x-direction, straps 538 are in compression while straps 536 are in tension. The result is a differential strain measurement that is thermally balanced and easily configured as a Wheatstone bridge circuit. In some embodiments, straps 536 and 538 are thermally isolated by removing all direct metal conduction paths connecting them. This reduces thermal noise in their sensor signal.

Isothermal Configurations

As noted above, piezoelectric actuator-based SPMs have limited mechanical bandwidth that manifests as a limited imaging rate. One way to improve measurement bandwidth is through integration of large arrays of SPMs that have a high aggregate scan rate that enables high-throughput nanometrology. For a number of reasons, however, piezoelectric actuators are difficult to utilize in an SPM array.

As also noted above, their small size, high force, and large deflection potential make thermal actuators attractive for use in arrayed SPMs. Unfortunately, when formed into arrays, the heat from the thermal actuation of one thermal actuator can couple into adjacent array elements thereby degrading their performance.

The present invention overcomes the issue of thermal crosstalk by combining thermal actuators that are arranged to operate in isothermal fashion such that the total power dissipation in the actuator combination remains constant throughout operation. As a result, the thermal profile of an array of SPMs in accordance with the present invention remains unchanged during actuation of the devices.

FIG. 6 depicts a schematic drawing of a one-dimensional isothermal actuator in accordance with the illustrative embodiment of the present invention. Actuator 310 includes SC-actuators 302-A and 302-B, flexures 306, and shuttle 304.

Flexures 306 are linkages that mechanically couple each of shuttles 510-A and 510-B to shuttle 304. Each of flexures 306 includes a plurality of beams 602. One skilled in the art will recognize that, by forming flexures 306 such that each includes a plurality of beams, the force transferred between shuttles 510-A and 510-B and shuttle 304 is amplified.

Shuttle 304 is analogous to shuttle 510. Like beams 512 and shuttle 510, flexures 306 and shuttle 304 are movable relative to substrate 110.

Returning now to method 200, in order for actuators 302-A and 302-B to operate in isothermal fashion, they must be arranged so that an equal and opposite change in power dissipation at the actuators gives rise to each actuator providing substantially the same amount of force on shuttle 304 in its desired direction of motion.

SC-actuators 302-A and 302-B are arranged such that they respond to an equal and opposite temperature change by moving shuttles 510-A and 510-B in opposite directions. For example, in response to an increase in the temperature of SC-actuator 302-A and equal decrease in the temperature of SC-actuator 302-B, shuttle 510-A is moved in the negative x-direction and shuttle 510-B is moved in the positive x-direction by the same amount. By virtue of shuttles 510-A and 510-B being connected to shuttle 304 via flexures 306, the movement of each of shuttles 510-A and 510-B imparts equal force in the negative y-direction on shuttle 304. In similar fashion, in response to a decrease in the temperature of SC-actuator 302-A and an equal increase in the temperature of SC-actuator 302-B, shuttle 510-A is moved in the positive x-direction and shuttle 510-B is moved in the negative x-direction by the same amount. The movement of each of shuttles 510-A and 510-B imparts equal force in the positive y-direction on shuttle 304.

In each case, since the temperature change of the two SC-actuators is equal and opposite, the total power dissipation of actuator 310 remains constant even as the SC-actuators move shuttle 304. As a result, the temperature of shuttle 304 also remains constant. In other words, actuator 310 is an isothermal actuator. Further, since the total power dissipation remains constant throughout operation of actuator 310, the flow of heat into or away from the region of the substrate containing actuator 310 also remains constant.

It should be noted that the linear arrangement of SC-actuators 302-A and 302-B along the x-direction is only one of many arrangements that result in isothermal operation of actuator 310. One skilled in the art will recognize, after reading this Specification, that SC-actuators 302-A and 302-B can be arranged at an angle between them having a magnitude anywhere within the range of 0° to 180°. For example, if SC-actuator 302-A is rotated 90° with respect to SC-actuator 302-B while still in parallel with the substrate plane, isothermal actuation of the pair would result in the shuttle deflecting along a path that is 45° with respect to the actuator deflections. In such a configuration, flexure beams 602 may be arranged along the mirror axes of the SC actuators.

By arranging two actuators 310 as depicted in FIGS. 3 and 6 (i.e., actuators 310-1 and 310-2) and coupling their respective shuttles 304-1 and 304-2 with platform 116, two-dimensional motion of the platform can be achieved while also maintaining isothermal operation of stage 102.

In an ideal case where the resistance values of heaters 506 are perfectly matched and their TCR is linear, a simple square root voltage input to heaters 506 would result in a nicely linear ramp for the output position of shuttle 304. Since the Joule-heating effect is proportional to power, the heat generated in an SC-actuator would be proportional to V*I (or $V^2/R$). For an input voltage of V=$\sqrt{x}$, therefore, the output position of shuttle 304 would be y=$v^2$/R, or y=x/R.

One skilled in the art will recognize, however, that in practice, the response of an actuator will vary slightly from device to device because the resistance of the heaters will vary due to process variations, etc. In addition, TCR is not linear with temperature. As a result, as part of operation 201, each of SC-actuators 302 is typically calibrated to ensure that the sum of all the powers dissipated in the SC-actuators remains constant in order to achieve a constant temperature at shuttle 304. The calibration of each of SC-actuators 302A and 302B includes at least the following steps:
  i. apply a linear voltage ramp to its heaters 506 and measuring the resultant I-V curve;
  ii. determine the resistance vs. voltage relationship from the I-V curve;
  iii. determine the power vs. voltage relationship from the I-V curve;
  iv. fit a polynomial to a plot of the power vs. voltage curve; and
  v. generate a drive voltage for each of SC-actuators 302A and 302B such that the sum of their powers remains constant at each point along the range of motion for shuttle 304.

It should be noted that, to scan shuttle 304 along a linear trajectory having equally spaced points, the voltages generated in step (v) should provide a fixed, linear increase in power for the first actuator, and an equivalent linear decrease in the power for the second actuator.

Although in the illustrative embodiment, scanner 114 is a Cartesian scanner, it will be clear to one skilled in the art, after reading this Specification, how to specify, make, and use alternative embodiments wherein scanner 114 moves platform 116 in a cylindrical manner. An exemplary cylindrical scanner in accordance with the present invention is described below and with respect to FIG. 13.

In order to scan platform 116 in the x-direction, shuttles 304-1 and 304-2 are moved in opposite directions along the y-axis. Motion of platform 116 in the y-direction is achieved by moving shuttles 304-1 and 304-2 in the same direction along the y-axis. Each of these motions of the shuttles along the y-direction is achieved without a change in the total power dissipation of their respective SC-actuators 302.

Although the illustrative embodiment employs SC-actuators, it will be clear to one skilled in the art, after reading this Specification, how to specify, make, and use alternative embodiments comprising different lateral thermal actuators that can be arranged in a configuration suitable for operation in an isothermal fashion. Actuators suitable for use in the present invention include, without limitation, any rectilinear thermal actuator, bimorph-based actuators, and the like.

Figures 6A, 6B:
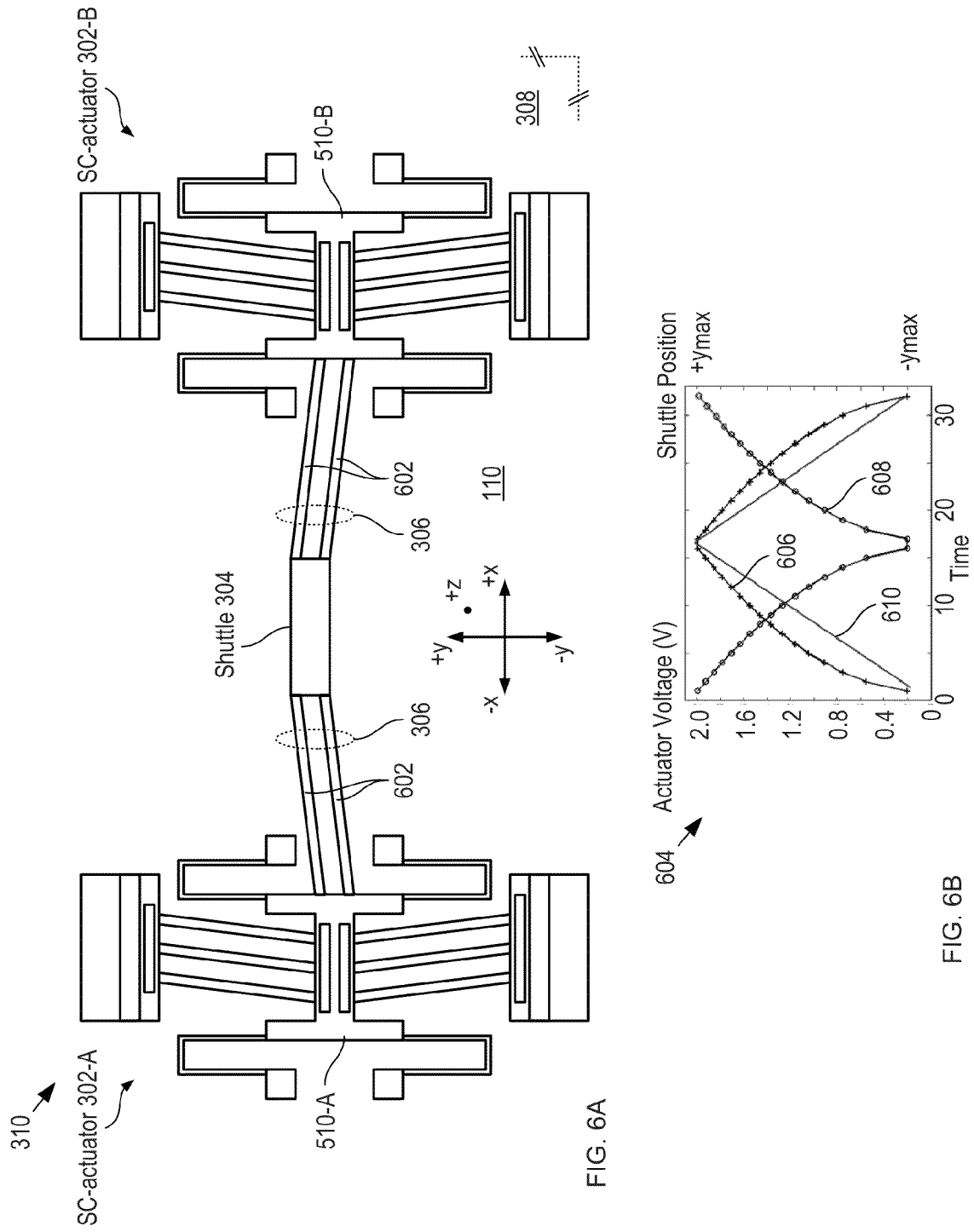
FIG. 6A depicts a schematic drawing of a one-dimensional isothermal actuator in accordance with the illustrative embodiment of the present invention.
FIG. 6B depicts a plot of the position of shuttle 304 with respect to the voltages applied to SC-actuators 302-A and 302-B.

FIG. 6B depicts a plot of the position of shuttle 304 with respect to the voltages applied to SC-actuators 302-A and 302-B. Plot 604 shows the applied voltages and corresponding position of shuttle 304 along the y-direction for a sweep of the shuttle from its extreme negative position (−ymax) to its extreme positive position (+ymax) and back. Traces 606 and 608 denote the voltages applied to the heaters 506 of SC-actuators 302-A and 302-B, respectively. Trace 610 indicates the position of shuttle 304 in response to these applied voltages.

It should be noted that, although scanner 102 is described herein as an element of a scanning probe microscope, it is suitable for use in any application that requires controllable one- or two-dimensional motion that is constrained within a plane.

Figure 7:
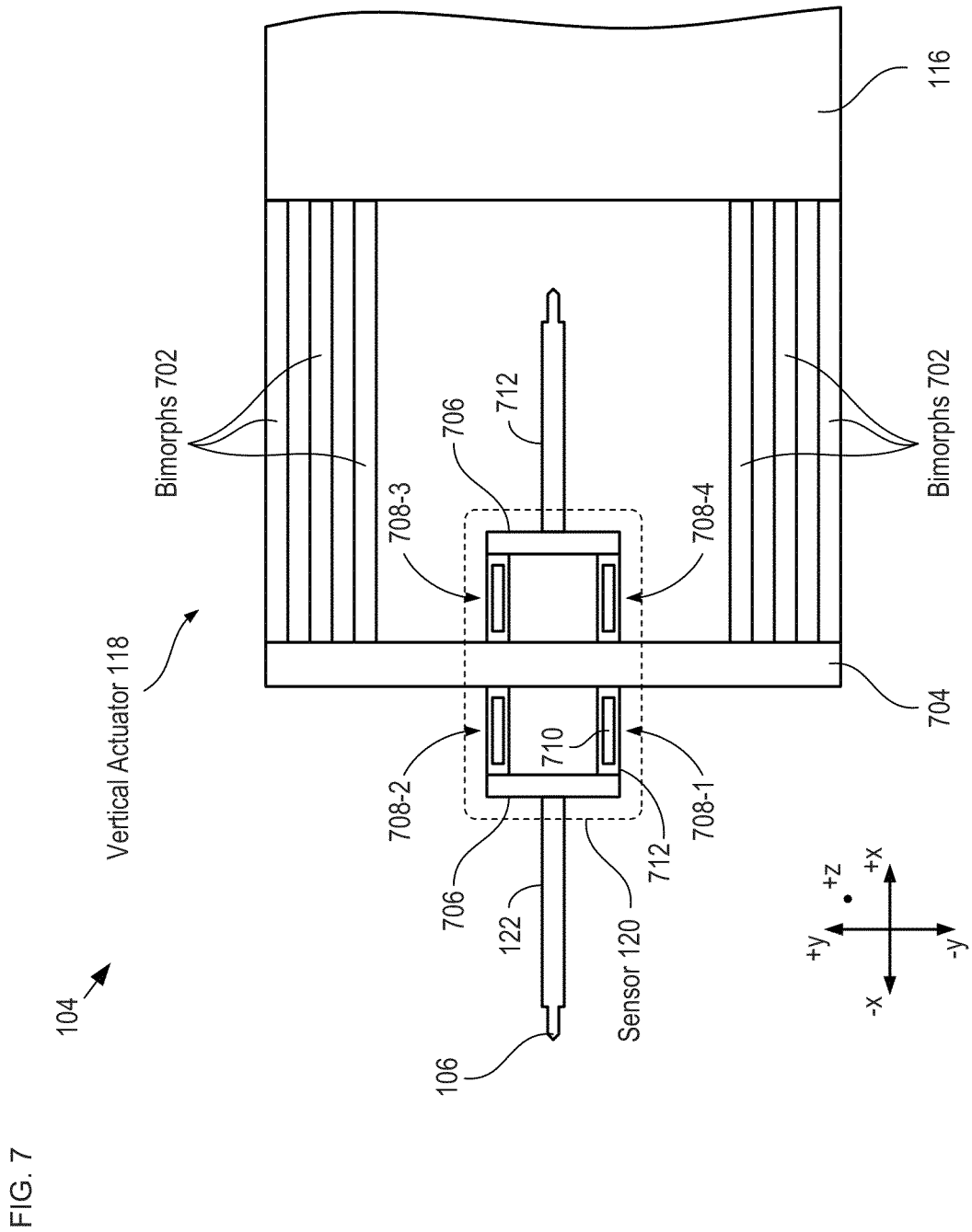
FIG. 7 depicts a cantilever in accordance with the illustrative embodiment of the present invention.

FIG. 7 depicts a cantilever in accordance with the illustrative embodiment of the present invention. Cantilever 104 includes vertical actuator 118, strain sensor 120, and extensions 122 and 712. Probe tip 106 projects from the free end of cantilever 104 (i.e., the end of extension 122). Cantilever 104 projects from stage 102 such that it extends past the edge of substrate 110, providing probe tip 106 unencumbered access to the surface of sample 112.

Vertical actuator 118 comprises a plurality of bimorph actuators 702 (referred to, collectively, as bimorphs 702) and coupling beam 704. Each of bimorph actuators 702 comprises silicon dioxide and metal layers of the CMOS BEOL layer stack.

As stage 102 scans probe tip 106 over the surface of sample 112, vertical actuator 118 changes the height of the probe tip to follow the topology of the surface. Although not shown for clarity, electrical connectivity to vertical actuator 118 and sensor 120 is typically routed through straps 602, as described above. In some embodiments, flexures that are highly compliant in the z-direction are used to route electrical signals to and from vertical actuator 118 and sensor 120.

Sensor 120 is a balanced strain sensor that includes coupling beam 706 and strain sensors 708-1 through 708-4. Each strain sensor 708 comprises a polysilicon piezoresistor 710 that is formed as a portion of CMOS-MEMS beam 712.

Strain sensors 708 are arranged in pairs on opposite sides of coupling beam 704 and electrically connected in a Wheatstone-bridge configuration that is analogous to that described above and with respect to FIG. 5C. As a result of their mechanical coupling with probe tip 106, strain sensors 708-1 and 708-2 give rise to signals that are based on tip-sample forces exerted on the probe tip. Strain sensors 708-3 and 708-4, however, are not affected by tip-sample interactions. They are included in sensor 120 to mitigate the effects of environmental stimuli, such as temperature changes, bimorph effect-induced strain, etc., which can give rise to spurious strain signals.

One skilled in the art will recognize that parasitic thermal coupling arises in piezoresistors 710 from at least four sources:

i. the TCR of the polysilicon gives rise to unintended resistance changes that are unrelated to the strain that is to be measured;

ii. piezoresistors 710 are embedded in a bimorph-like beam, which bends upon heating to give rise to a parasitic strain in the beam that is also unrelated to the tip-sample force that is to be measured;

iii. the movement of vertical actuator 118 includes both resonance motion and motion that results from tracking the topology of sample 112. This causes forced convective cooling of the piezoresistors as they pass through the air. Depending on the location of the piezoresistors, this motion may be larger for some piezoresistors and smaller for others; and iv. electrothermal actuators undergo large temperature excursions while operating. Polysilicon has a substantial TCR. As a result, temperature variation within a sensor leads to a parasitic disturbance that competes with the signal of interest.

Since identical structure is included on either side of coupling beam 704, the thermal path from on-chip thermal actuators is the same for each piezoresistor. The balanced configuration of sensors 708 also means that piezoresistors 710 experience the same temperature at all times. As a result, induced strain in the piezoresistors due to the response of the bimorph structures to temperature changes are substantially the same for each piezoresistor. Since tip-sample forces give rise to additional strain in only strain sensors 708-1 and 708-2, these forces manifest as a differential signal from strain sensor 120 that is thermally balanced and easily configured as a Wheatstone bridge circuit. The balanced configuration of sensor 120, therefore, mitigates some or all of the above effects.

In some embodiments, a proof mass is added to extension 122 to separate its resonant frequency from that of cantilever 104 as a whole. It should be noted, however, that, in such embodiments, temperature effects are not compensated completely. This is due to the fact that the thermal load is different between the strain sensors connected to extension 122 because the thermal capacitance of the proof mass loads only the piezoresistors of strain sensors 708-1 and 708-2. In addition, as cantilever 104 resonates, a forced-convection effect on sensor 120 is unbalanced because strain sensors 708-1 and 708-2 deflect farther than strain sensors 708-3 and 708-4 due to the arcuate path of vertical actuator 118. As a result, the piezoresistors 710 included in strain sensors 708-1 and 708-2 experience more cooling than the piezoresistors included in strain sensors 708-3 and 708-4.

It should be noted that, when the piezoresistor of a strain sensor 708 is close to surface 124, heat transfer can occur between the surface and the piezoresistor through the intervening environment. Because cantilever 104 is typically oriented at an angle to surface 124 when SPM 100 is engaged with, or approaching, the surface, strain sensors 708-1 and 708-2 are closer to surface 124 than strain sensors 708-3 and 708-4. As a result, more heat transfer occurs between the surface and strain sensors 708-1 and 708-2 than between the surface and strain sensors 708-3 and 708-4. This gives rise to a differential signal that is indicative of the separation between probe tip 106 and surface 124.

In some embodiments, this differential signal is measured and exploited to improve the control and speed with which SPM 100 can be brought into engagement with a sample surface. This capability represents a significant advantage over prior-art SPM systems, which typically employ a "hunt-and-seek" method for bringing a probe tip into its measurement position.

An exemplary approach for bringing SPM 100 into engagement with sample 112 includes:

i. moving sample 112 (or at least one of sample 112 and SPM 100) at a first rate to reduce the separation between surface 124 and probe tip 106;

ii. measuring a first output signal based on the resistance of strain sensors 708-1 and 708-2;

iii. measuring a second output signal based on the resistance of strain sensors 708-3 and 708-4;

iv. computing the difference between the first and second output signals; and v. stopping the motion of sample 112 when the difference reaches a predetermined value that is based on the desired separation between surface 124 and probe tip 106.

In some cases, the point at which the motion of sample 112 is stopped leaves the separation between the sample and probe tip at an intermediate separation that can be safely established while moving the sample at the first rate. Once this intermediate separation is established in operation (v), the separation between the sample and the probe tip can be changed at a slower rate to establish the desired separation.

In some embodiments, an identical proof mass is added to each of extensions 122 and 710. In such embodiments, DC thermal compensation is improved, since both proof masses experience the same convective cooling under quasi-static conditions. When the cantilever is in resonance, however, the proof mass added to extension 122 experiences greater convective cooling than the proof mass added to extension 122.

Although the illustrative embodiment includes two strain sensors located on either side of coupling beam 704, in some embodiments, a single strain sensor is included on either side of the coupling beam. In some embodiments, more than two strain sensors are located on either side of coupling beam 704.

In some embodiments, strain sensors 708-3 and 708-4 are located elsewhere in cantilever 104 such that they are unaffected by strain due to tip-sample interaction but do experience the same (or similar) thermal conditions as strain sensors 708-1 and 708-2. Such configurations enable analogous compensation of TCR and parasitic strain effects as described above.

It should be noted that the location of piezoresistors 710 in the layer structure of as-formed CMOS-MEMS beam 712 is not ideal because its responsivity is limited due to the CMOS BEOL layer structure itself. It is yet another aspect of the present invention, however, that the responsivity of a strain sensor can be improved by including a simple post-processing operation to change the neutral axis of beams 712 after release of extensions 122 and 710 and singulation of the SPM die.

In some embodiments, cantilever 104 includes a heater, such as heater 506, where the heater is arranged to provide periodic excitation to each of temperature sensors located similarly to strain sensors 708. This enables the use of lock-in measurements that can further suppress drift and band-limit the measurement of the tip-sample thermal interactions. Typically, this heater is located on coupling beam 704.

Figure 8A:
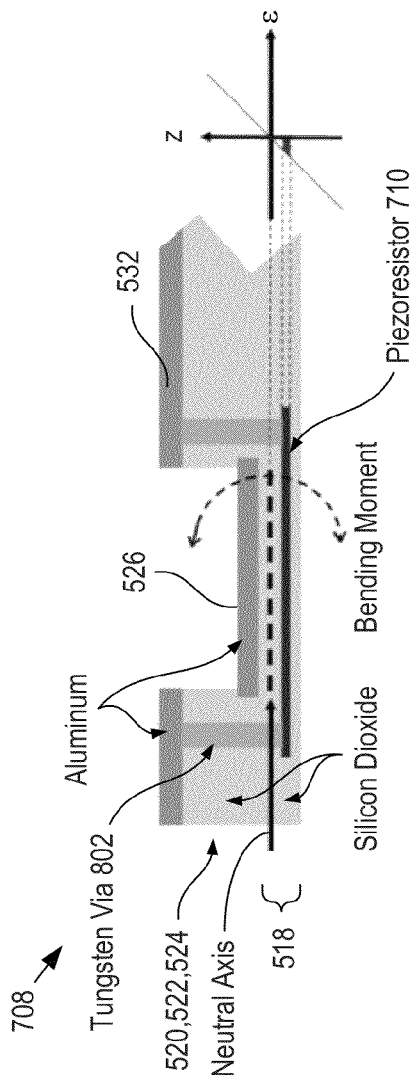
FIG. 8A depicts a schematic drawing of a cross-sectional view of strain sensor 708 in its as-formed state at the completion of a conventional CMOS-MEMS process.

FIG. 8A depicts a schematic drawing of a cross-sectional view of strain sensor 708 in its as-formed state at the completion of a conventional CMOS process. In strain sensor 708, piezoresistor 710 is located very near the neutral axis of beam 712. As a bending moment develops in the beam, therefore, piezoresistor 710 is subjected to only slight strain.

Figure 8B:
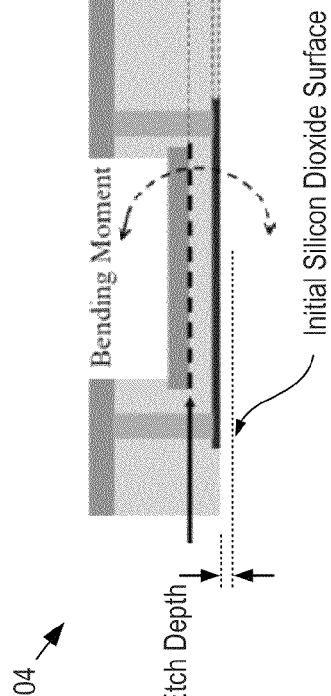
FIG. 8B depicts a schematic drawing of a cross-sectional view of an alternative piezoresistive strain sensor in accordance with the present invention.

FIG. 8B depicts a schematic drawing of a cross-sectional view of an alternative piezoresistive strain sensor in accordance with the present invention. Strain sensor 804 is analogous to strain sensor 708; however, a portion of silicon dioxide layer 518 is removed from strain sensor 804 using a backside oxide etch. As a result, the neutral axis of beam 712 is shifted upward and away from piezoresistor 710 enabling significantly more strain to develop in piezoresistor 710. This provides strain sensor 804 with increased strain sensitivity—up to a 500% improvement in strain sensitivity (a >12 dB improvement in signal-to-noise ratio (SNR)) as compared to strain sensor 708.

It should be noted that the backside oxide etch can easily be performed after the mechanically active elements of SPM 100 (including cantilever 104) have been released from substrate 110 in a sacrificial etch, as well as after die singulation is performed (typically via a "scribe and break" operation). Once the individual die (or rows of die) have been separated, cantilever 104 projects over chip edge 124, as depicted in FIG. 1. As a result, when the oxide etch is performed from the backside of the chip, only the region in which piezoresistors 710 are located is exposed since the substrate acts as a mask that protects the remaining structure.

Figure 8C:
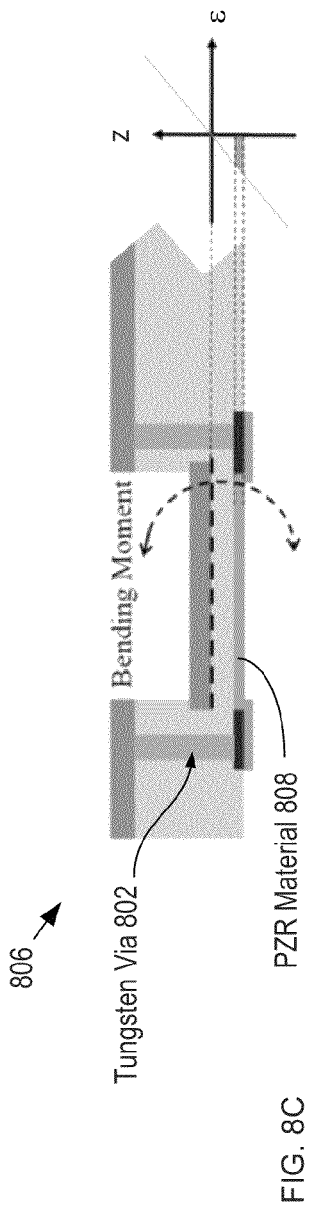
FIG. 8C depicts a schematic drawing of a cross-sectional view of another alternative piezoresistive strain sensor in accordance with the present invention.

FIG. 8C depicts a schematic drawing of a cross-sectional view of another alternative piezoresistive strain sensor in accordance with the present invention. Strain sensor 806 is analogous to strain sensor 708; however, a portion of silicon dioxide layer 518 is removed from the backside of cantilever 104 thereby exposing tungsten vias 802. After removal of the polysilicon material, it is replaced with piezoresistive material 808, which is an alternative piezoresistive material having higher piezoresistivity than polysilicon (e.g., SiC, etc.). Piezoresistive material 808 is typically deposited onto the devices through a shadow-mask. The use of a higher piezoresistivity material in the piezoresistor further improves the SNR (signal to noise ratio) of the strain sensor.

Although the illustrative embodiment includes a vertical actuator that provides arcuate deflection of probe tip 106, in some embodiments it is preferable to use a rotating actuator for vertical actuator 118.

FIG. 9A depicts a schematic drawing of a first alternative vertical actuator in accordance with the present invention. Actuator 900 is an isothermal rotating actuator comprising torsion elements 902-1 and 902-2, proof masses 908-1 and 908-2, coupling beam 704, sensor 120, extensions 122 and 712, and probe tip 106.

Each of torsion elements 902-1 and 902-2 includes a plurality of bimorphs 904, which are grouped into operative sets. Adjacent operative sets are rigidly interconnected via beams 906 such that bending of the operative sets within a torsion element is additive.

Torsion elements 902-1 and 902-2 are rigidly connected to platform 116 via rigid links 910 and arranged such that they rotate about rotation axis 912 in the same direction when subjected to opposite temperature changes. As a result, their collective power dissipation remains constant during operation. It should be noted that, in this configuration, coupling beam 704 operates as a third shuttle (analogous to shuttle 304) in an isothermal actuator that rotates the coupling beam and extensions 122 and 712 about rotation axis 912.

It should be noted that the cantilever depicted in FIG. 9A includes proof masses 908-1 and 908-2, which are physically connected with extensions 122 and 712, respectively. Further, extensions 122 and 712 are connected to coupling beam 704 through the sensor elements of sensor 120.

Actuator 900 substantially doubles the signal that can be attained using vertical actuator 118 because it places the piezoresistors in sensor 120 in resonance with 180° of relative phase shift. Furthermore, this configuration compensates AC temperature fluctuations, since the thermal load seen by all resistors is the same.

It should also be noted that this configuration also balances the parasitic thermal coupling effects described above and with respect to strain sensors 708 depicted in FIG. 7.

Finally, the use of an isothermal vertical actuator, such as actuator 900, also enables complete isothermal operation of a scanning probe microscope.

FIG. 9B depicts a schematic drawing of a portion of a cantilever having a sensor configuration that is particularly well suited for use with vertical actuator 900. Cantilever 914 includes strain sensors 708-1 through 708-4, extension 122, probe tip 106, proof mass 908, and rigid links 910.

Strain sensors 708 are arranged in pairs on either side of rotation axis 918. As a result, tip-sample forces imparted on probe tip 106 give rise to a torque at the base of extension 122, which rotates about rotation axis 918. This rotation gives rise to equal and opposite strains in the piezoresistors located on opposite sides of the rotation axis.

It should be noted that, although the arrangement of strain sensors in sensor 916 is particularly well suited for operation with vertical actuator 900, it is suitable for use in any of the SPM arrangements described herein.

Figure 10:
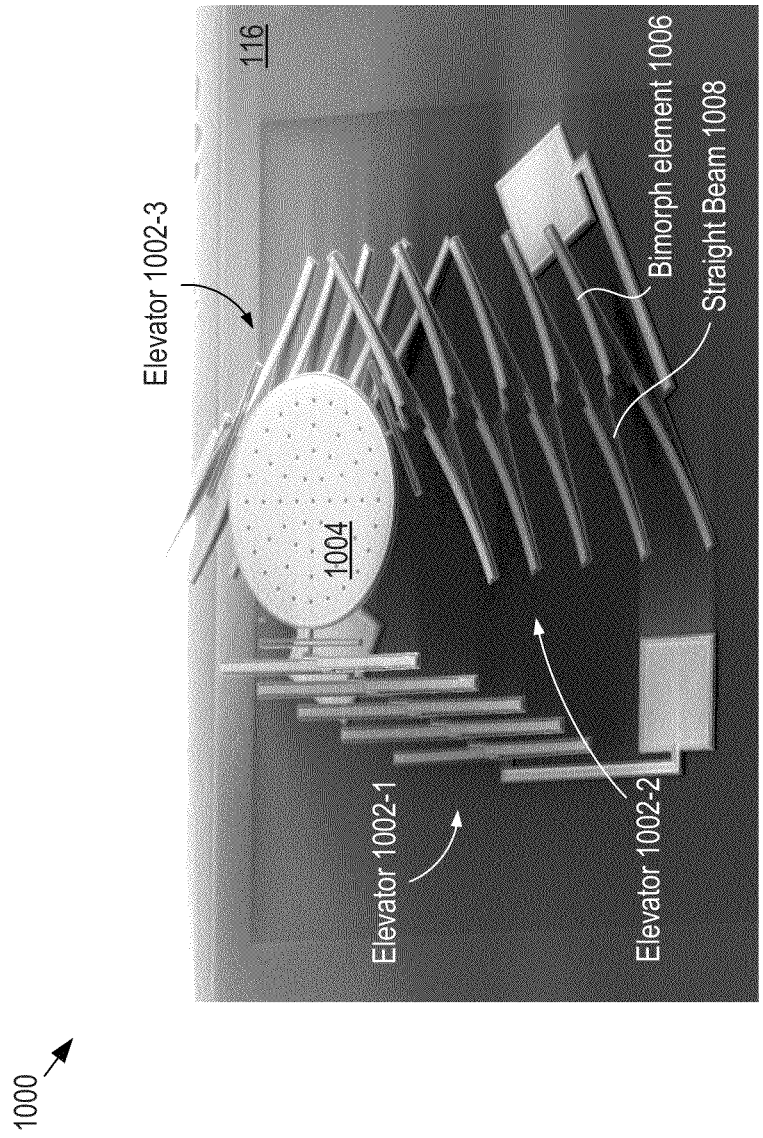
FIG. 10 depicts a schematic drawing of a second alternative vertical actuator in accordance with the present invention.

FIG. 10 depicts a schematic drawing of a second alternative vertical actuator in accordance with the present invention. Actuator 1000 is piston-style vertical actuator comprising elevators 1002-1 through 1002-3 and plate 1004. Typically probe tip 106 (not shown) projects upward from the center of plate 1004.

Elevators 1002-1 through 1002-3 (referred to, collectively, as elevators 1002) are mechanically coupled with platform 116. Each of elevators 1002 is a serial combination of alternating bimorph elements 1006 and straight beams 1008. As a result, flexure of the bimorph elements is additive. In addition, the configuration also provides mechanical amplification of the flexure of the bimorph elements by virtue of straight beams 1008.

In some embodiments, actuator 1000 is arranged as an isothermal actuator by providing matching upward-actuating elevators and downward-actuating elevators, as described in U.S. Patent Publication No. 20070001248, which is incorporated herein by reference.

Figure 11:
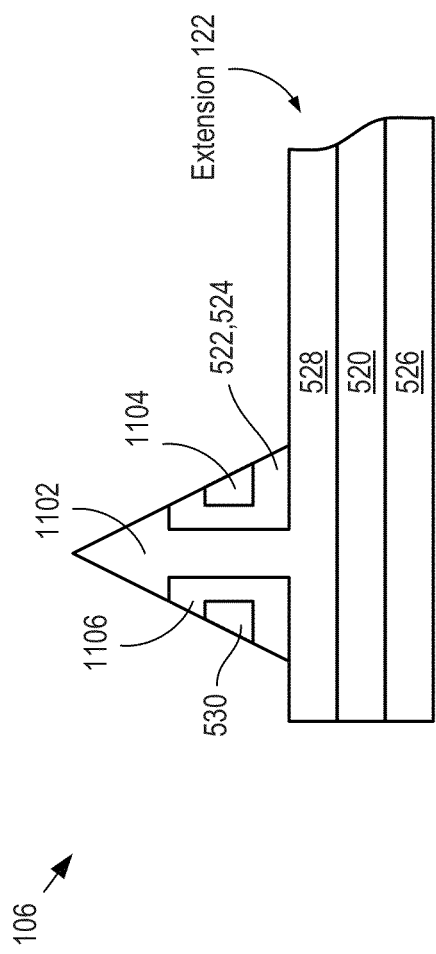
FIG. 11 depicts a schematic drawing of a probe tip in accordance with the illustrative embodiment.

FIG. 11 depicts a schematic drawing of a probe tip in accordance with the illustrative embodiment. Probe tip 106 includes core 1102, conductor ring 1104, and interlayer dielectric 1106.

Core 1102 includes portions of aluminum layers 526 and 530, as described above and with respect to FIG. 5B.

Conductor ring 1104 is a portion of aluminum layer 528.

Interlayer dielectric 1106 includes portions of silicon dioxide layers 522 and 524. Interlayer dielectric 1106 electrically isolates core 1102 and conductor ring 1104 such that they can be used as separate electrical contacts, if desired. In such embodiments, conductive interconnects are typically formed to provide separate signal routing to core 1102 and conductor ring 1104.

It should be noted that, while AFM applications do not typically require an electrically active probe tip, such as element is desirable in some embodiments of the present invention.

In some embodiments, after its formation, a layer of another material is formed on the exposed surface of the probe tip 106 to further functionalize the probe. For example, in some embodiments, a layer of vanadium oxide is deposited on probe tip 106 (by e.g., plasma-vapor deposition, pulsed-laser deposition, etc., through a shadow mask) such that it forms a continuous layer between core 1102 and conductor ring 1104. The resultant structure would be suitable for use as a bolometer probe, among other applications.

In some embodiments, the exposed surface of probe tip 106 is coated with a different material to enable different or augmented capabilities, such magnetic field detection, electret behavior, specific binding to an analyte of interest, improved wear properties, and the like.

Figure 12:
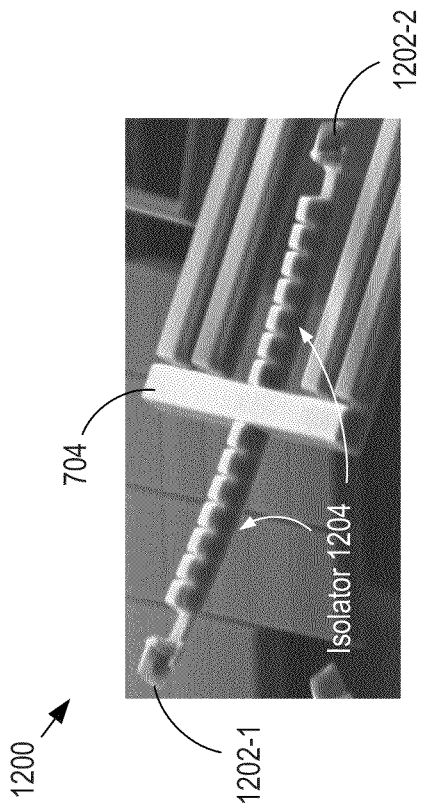
FIG. 12 depicts an alternative probe tip structure in accordance with the present invention.

FIG. 12 depicts an alternative probe tip structure in accordance with the present invention. Probe tip 1200 includes temperature sensors 1202-1 and 1202-2 and isolators 1204.

Each of temperature sensors 1202-1 and 1202-2 is a thermocouple-style temperature sensors (based on the Seebeck effect).

Each of isolators 1204 is a region of patterned silicon dioxide that inhibits the flow of heat to and from temperature sensors 1202-1 and 1202-2.

Temperature sensors 1202-1 and 1202-2 are arranged on opposite sides of coupling beam 704. As described above, vis-à-vis sensor 120, the differential arrangement of the temperature sensors compensates for thermal coupling effects from the scanning actuators. In some embodiments, temperature sensors 1202-1 and 1202-2 are bolometer-style temperature sensors (based on the TCR of their constituent materials).

Although the illustrative embodiment employs a Cartesian two-dimensional actuator for moving platform 116 about the scanning region, in some cases, it is desirable to scan probe tip 106 in a cylindrical fashion. By reconfiguring the arrangement of SC-actuators 202 and tethers 206, a two-dimensional isothermal scanner can be provided for moving platform 116 within plane 208.

Figure 13:
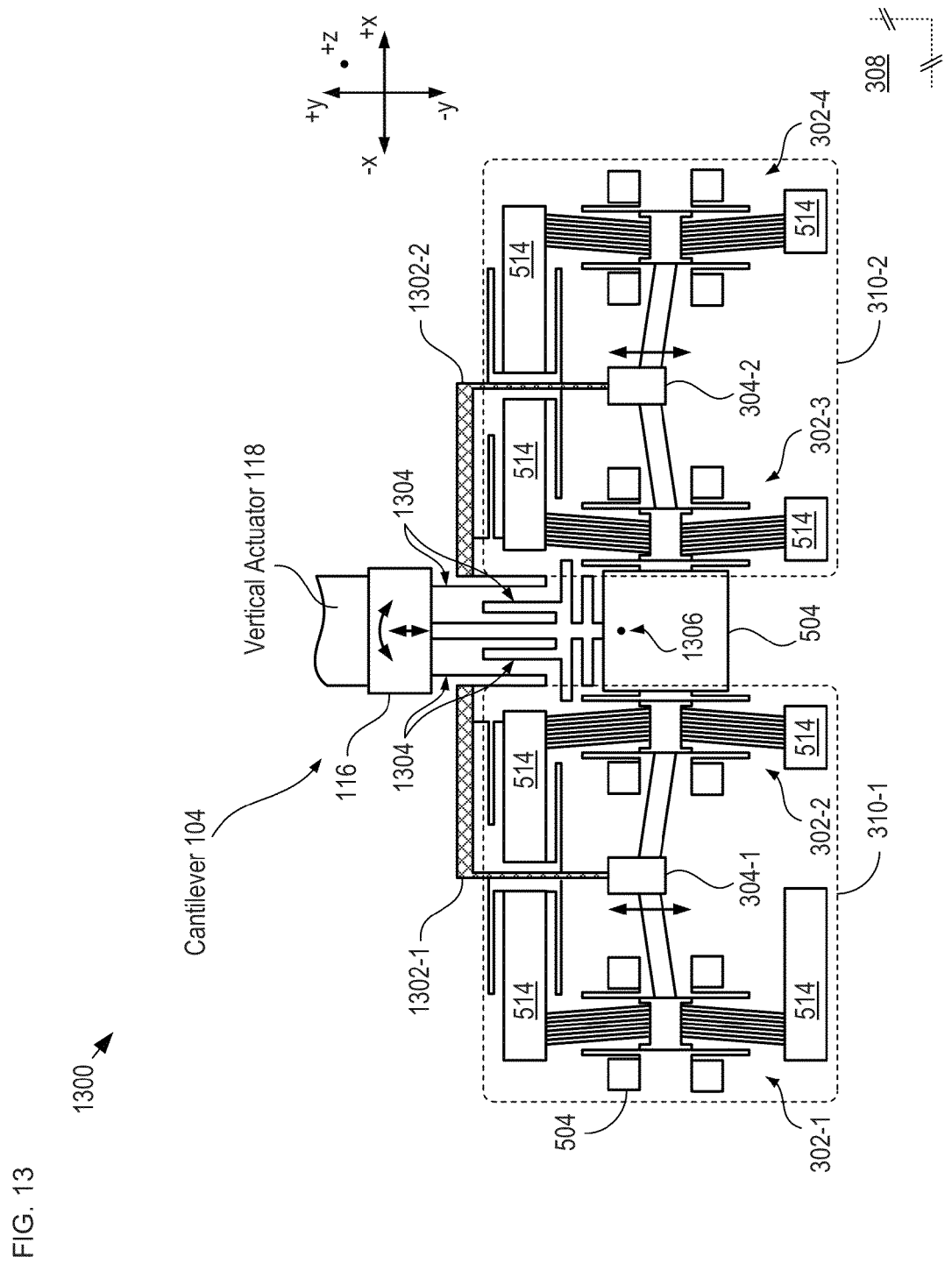
FIG. 13 depicts a schematic drawing of an alternative two-dimensional isothermal thermal actuator in accordance with the present invention.

FIG. 13 depicts a schematic drawing of an alternative two-dimensional isothermal thermal actuator in accordance with the present invention. Actuator 1300 is a two-dimensional isothermal cylindrical actuator comprising SC-actuators 302-1 through 302-4, shuttles 304-1 and 304-2, rigid beams 1302-1 and 1302-2, and flexures 1304, which are collectively operative for moving platform 116 selectively within x-y plane 308. As noted above, x-y plane 308 is substantially parallel with the plane of underlying substrate 110.

SC-actuators 302-1 and 302-2 are mechanically coupled to collectively define one-dimensional isothermal actuator 310-1 and SC-actuators 302-3 and 302-4 are mechanically coupled to collectively define one-dimensional isothermal actuator 310-2, as described above and with respect to FIG. 6.

Shuttles 304-1 and 304-2 are coupled to platform 116 via flexures 1304 and rigid beams 1302-1 and 1302-2, respectively.

Like straps 502, flexures 1304 are selectively flexible in plane 308; however, flexures 1304 are expressly designed to enable both rotation and translation of platform 116 about point 1306. Point 1306 is the center of rotation for cantilever 104.

Cantilever 104 rotates about point 1306 in response to motion of shuttles 304-1 and 304-2 in opposite direction along the y-axis. Cantilever 104 translates radially to or away from point 1306 in response to motion of shuttles 304-1 and 304-2 in the same direction along the y-axis. Because of the arrangement of SC-actuators 302 actuators 310, each of these motions can be effected with a substantially constant power dissipation at each of actuators 310. As a result, actuator 1300 can maintain the same thermal distribution throughout the entire range motion of platform 118.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. An apparatus comprising:
a substrate that defines a first plane;
a first platform that defines a second plane that is parallel with the first plane; and
a first scanner that is operative for moving the first platform in two dimensions within the second plane, wherein the first scanner is dimensioned and arranged to constrain motion of the first platform to the second plane, the first scanner comprising a plurality of thermal actuators that are mechanically coupled such that they collectively define an isothermal scanner;
wherein the first platform, the first scanner, and the substrate are monolithically integrated.

2. The system of claim 1 further comprising:
a first probe tip; and
a first cantilever that is mechanically connected with the first platform such that the first cantilever has a first free end, wherein the first cantilever comprises;
a first actuator that is operative for controlling a first separation between the first probe tip and a surface, the first probe tip being disposed at the first free end; and
a first sensor that is operative for providing a first signal based on a first interaction force between the first probe tip and the surface;
wherein the first cantilever and the substrate are monolithically integrated.

3. The system of claim 2, wherein each of the first scanner, the first platform, and the first cantilever includes at least one layer of a CMOS layer stack.

4. The system of claim 2, wherein the cantilever has a first thickness in a first region and a second thickness in a second region, the second thickness being less than the first thickness, and wherein the second region includes at least a portion of the first sensor.

5. The system of claim 1 further comprising:
a first probe tip comprising a first thermal sensor, the first probe tip being operative for providing a first signal based on a temperature at a surface;
a second thermal sensor that is dimensioned and arranged such that it provides a second signal that is independent of the temperature at the surface; and
a cantilever that is mechanically connected with the first platform such that the first cantilever has a first free end, wherein the first cantilever includes;
the first probe tip, wherein the first probe tip is disposed at the first free end;
the second thermal sensor;
a first heater that is operative for providing a periodic thermal signal to the first sensor; and
a first actuator that is operative for controlling a first separation between the first probe tip and the surface;
wherein the first cantilever and the substrate are monolithically integrated.

6. The system of claim 2, wherein the first probe tip includes a plurality of regions that are electrically conductive, and wherein the plurality of regions are electrically isolated from one another.

7. The system of claim 2, wherein the first actuator is an isothermal actuator.

8. The system of claim 2, wherein the first sensor comprises a first sensor element and a second sensor element, the first sensor element and second sensor elements, wherein the first sensor element provides a second signal that is based on the first force, and wherein the second sensor element provides a third signal that is independent of the first force, and further wherein the first signal is based on the second signal and the third signal.

9. The system of claim 2 further comprising:
   a second platform;
   a second scanner that is operative for moving the second platform selectively within the second plane, the second scanner being an isothermal actuator;
   a second probe tip; and
   a second cantilever that is mechanically connected with the second platform such that the second cantilever has a second free end, wherein the second cantilever comprises;
   a second actuator that is operative for controlling a second separation between the second probe tip and the surface, the second probe tip being disposed at the second free end; and
   a second sensor that is operative for providing a second signal based on a second interaction force between the second probe tip and the surface;
   wherein the second platform, the second scanner, the second cantilever, and the substrate are monolithically integrated.

10. The system of claim 1, wherein the plurality of thermal actuators includes a first thermal actuator, the first thermal actuator comprising:
    a first chevron actuator having a first shuttle; and
    a first strap that is dimensioned and arranged to be flexible within the second plane and not flexible out of the second plane, the first strap being operatively coupled with the first shuttle such that it constrains motion of the first shuttle to the second plane.

11. The system of claim 10, wherein the first shuttle further includes a heater that is thermally coupled with the first shuttle.

12. The system of claim 11, wherein the first chevron actuator further includes a first anchor that comprises a thermal isolation region that is operative for impeding a flow of heat between the first shuttle and the substrate.

13. The system of claim 10, wherein the first strap is dimensioned and arranged to convey heat between the first shuttle and the substrate.

14. The system of claim 10, wherein the first strap is electrically conductive.

15. The system of claim 10, wherein the first strap includes a strain sensor that is operative for providing a second signal that is based on strain imparted on the first strap.

16. The system of claim 10, wherein the plurality of thermal actuators includes a second thermal actuator, the second thermal actuator comprising:
    a second chevron actuator having a second shuttle; and
    a second strap that is dimensioned and arranged to be flexible within the second plane and not flexible out of the second plane, the second strap being operatively coupled with the second shuttle such that it constrains motion of the second shuttle to the second plane;
    wherein the first thermal actuator and second thermal actuator are mechanically coupled with the first platform;
    wherein an increase of a first magnitude in the temperature of the first thermal actuator gives rise to a first force on the first platform, the first force being directed along a first direction in the second plane; and
    wherein a decrease of the first magnitude in the temperature of the second thermal actuator gives rise to a second force on the first platform, the second force being directed along the first direction and being equal to the first force.

17. The system of claim 16, wherein the first thermal actuator, second thermal actuator, and first platform are mechanically coupled such that the first scanner moves the first platform in cylindrical fashion.

18. An apparatus comprising:
    (1) a substrate that defines a first plane;
    (2) a first thermal actuator that includes a first chevron actuator and a first strap, the first strap being dimensioned and arranged to constrain motion of the first chevron actuator to a second plane that is parallel with the first plane;
    (3) a second thermal actuator that includes a second chevron actuator and a second strap, the second strap being dimensioned and arranged to constrain motion of the second chevron actuator to the second plane; and
    (4) a first shuttle that is mechanically coupled with each of the first thermal actuator and second thermal actuator, wherein the first shuttle and the first and second thermal actuators collectively define a first scanner that is a one-dimensional isothermal actuator;
    wherein the first thermal actuator, second thermal actuator, and first shuttle are monolithically integrated on the substrate.

19. The system of claim 18, wherein each of the first thermal actuator, second thermal actuator, and first shuttle includes at least one layer of a CMOS layer stack.

20. The apparatus of claim 18 further comprising:
    (5) a third thermal actuator that includes a third chevron actuator and a third strap, the third strap being dimensioned and arranged to constrain motion of the third chevron actuator to the second plane;
    (6) a fourth thermal actuator that includes a fourth chevron actuator and a fourth strap, the fourth strap being dimensioned and arranged to constrain motion of the fourth chevron actuator to the fourth plane; and
    (7) a second shuttle that is mechanically coupled with each of the third thermal actuator and fourth thermal actuator, wherein the second shuttle and the third and fourth thermal actuators collectively define a second scanner that is a one-dimensional isothermal actuator;
    wherein the third thermal actuator, fourth thermal actuator, and second shuttle are monolithically integrated on the substrate.

21. The system of claim 20, further comprising (8) a platform that is mechanically coupled with each of the first scanner and second scanner such that the platform, first scanner, and second scanner collectively define a two-dimensional isothermal actuator.

22. The system of claim 21 further comprising:
    (9) a probe tip; and
    (10) a cantilever that is mechanically connected with the platform such that the cantilever has a free end, wherein the cantilever includes;
    (a) a fifth thermal actuator that is operative for controlling a separation between the probe tip and a surface, the probe tip being disposed at the free end; and
    (b) a sensor that is operative for providing a first signal based on characteristic of the surface.

23. The system of claim 22, wherein the characteristic is temperature.

24. The system of claim 22, wherein the characteristic is an interaction force between the surface and the probe tip.

25. The system of claim 24, wherein the sensor includes:
a first sensor element that is mechanically coupled with the probe tip such that the first sensor element is operative for providing a second signal that is based on the interaction force; and
a second sensor element that is operatively decoupled from the probe tip such that the second sensor element is operative for providing a third signal that is independent of the interaction force;
wherein the first signal is based on the second signal and third signal.

26. The system of claim 18, wherein the first thermal actuator includes a first heater that is located at a first shuttle, the first heater being operative for at least partially controlling the temperature of the first chevron actuator, wherein the first chevron actuator includes the first shuttle, and wherein the first chevron actuator is an externally heated chevron actuator.

27. The system of claim 26, wherein the first thermal actuator includes a second heater, the second heater being located at a first anchor and being operative for at least partially controlling the temperature of the first chevron actuator, wherein the first chevron actuator includes the first anchor.

28. The system of claim 26, wherein the first thermal actuator includes a first thermal isolation region that is located at a first anchor, the first thermal isolation region being operative for impeding a flow of heat between the first chevron actuator and the substrate, wherein the first chevron actuator includes the first anchor.

29. A method comprising:
providing a scanner that is monolithically integrated on a substrate that defines a first plane, wherein the scanner is provided such that it includes a plurality of thermal actuators that are mechanically coupled to collectively define an isothermal scanner that is operative for scanning a platform selectively within a first region of a second plane that is parallel with the first plane;
controlling a first separation between a probe tip and a surface, wherein the probe tip is disposed at a free end of a cantilever that is mechanically connected with the platform, and wherein the cantilever includes (1) a first thermal actuator for controlling the first separation and (2) a sensor for providing a first signal that is based on a characteristic of the surface;
isothermally scanning the probe tip over a second region, the surface including the second region; and
detecting the interaction force.

30. The method of claim 29 further comprising generating a map of the characteristic of the surface in the first region.

31. The method of claim 29 wherein the characteristic is an interaction force between the probe tip and the surface.

32. The method of claim 29 wherein the characteristic is temperature.

33. The method of claim 29 further comprising driving the cantilever into resonance.

34. The method of claim 29, wherein the scanner is provided such that the plurality of thermal actuators includes (1) a second thermal actuator that includes a first chevron actuator and a first strap that is dimensioned and arranged to constrain motion of the first chevron actuator to the second plane and (2) a third thermal actuator that includes a second chevron actuator and a second strap that is dimensioned and arranged to constrain motion of the second chevron actuator to the second plane.

35. The method of claim 34 further comprising:
providing the first chevron actuator such that it includes a first shuttle having a heater; and
controlling a voltage provided to the heater to control the temperature of the first chevron actuator.

36. The method of claim 35 further comprising providing the first chevron actuator such that it includes a first anchor having a thermal isolation region for impeding the flow of heat between the first chevron actuator and the substrate.

37. The method of claim 34, wherein the scanner is provided such that the plurality of thermal actuators includes a second thermal actuator and a third thermal actuator, and wherein each of the second thermal actuator and third thermal actuator includes a chevron actuator and a strap that is dimensioned and arranged to constrain motion of the chevron actuator to the second plane.

38. The method of claim 29 wherein the scanner is provided by fabricating it in a CMOS fabrication process.

39. The method of claim 29 further comprising:
providing the cantilever such that the sensor includes (1) a first sensor element that is sensitive to the characteristic and (2) a second sensor element that is insensitive to the characteristic;
measuring a second signal at the first sensor element;
measuring a third signal at the second sensor element; and
providing the first signal based on the second signal and third signal.

40. The method of claim 29 further comprising establishing second separation that is based on the first separation, wherein the second separation is established by operations including:
providing the cantilever such that the sensor includes (1) a first sensor element that is proximal to the probe tip and (2) a second sensor element that is distal to the probe tip;
measuring a second signal at the first sensor element;
measuring a third signal at the second sensor element;
changing a third separation between the probe tip and the surface; and
establishing the third separation as the second separation when a difference between the second signal and third signal is equal to a predetermined value.

41. The method of claim 29 wherein the separation between the probe tip and the surface is controlled such that the probe tip maintains a constant temperature.

* * * * *